United States Patent
Nomizo et al.

(10) Patent No.: US 8,125,269 B2
(45) Date of Patent: Feb. 28, 2012

(54) INTEGRATED CIRCUIT DEVICE AND ELECTRONIC INSTRUMENT

(75) Inventors: Hiroaki Nomizo, Nagano (JP); Atsushi Ishikawa, Fujimi (JP); Tsuyoshi Tamura, Hara-mura (JP)

(73) Assignee: Seiko Epson Corporation (JP)

( * ) Notice: Subject to any disclaimer, the term of this patent is extended or adjusted under 35 U.S.C. 154(b) by 1534 days.

(21) Appl. No.: 11/545,625

(22) Filed: Oct. 10, 2006

(65) Prior Publication Data

US 2007/0082626 A1    Apr. 12, 2007

(30) Foreign Application Priority Data

Oct. 11, 2005  (JP) ................................. 2005-296362
Jun. 21, 2006  (JP) ................................. 2006-170946

(51) Int. Cl.
    *H03K 17/687* (2006.01)
(52) U.S. Cl. .......... 327/603; 326/41; 327/379; 327/551; 327/564; 361/56; 257/355
(58) Field of Classification Search .................. 257/355, 257/356, 360; 326/41; 327/379–381, 551, 327/564, 565, 603; 361/54, 56
See application file for complete search history.

(56) References Cited

U.S. PATENT DOCUMENTS 6,552,583 B1 *  4/2003  Kwong ......................... 327/112

(Continued)

FOREIGN PATENT DOCUMENTS

JP        2003-234647         8/2003

*Primary Examiner* — Lincoln Donovan
*Assistant Examiner* — William Hernandez
(74) *Attorney, Agent, or Firm* — Harness, Dickey & Pierce, P.L.C.

(57) ABSTRACT

An integrated circuit device includes an I/O circuit which buffers and outputs an input signal D from a pad when an enable signal ENB is set at a second voltage level, a circuit block to which an output signal from the I/O circuit is input, and a malfunction prevention circuit which outputs to the circuit block an output signal QP of which a voltage level is set by a first power supply VDDC in a period T1 in which the signal ENB is set at a first voltage level and a period T2 including a period in which the signal ENB changes from the first voltage level to the second voltage level, and outputs to the circuit block the output signal QP corresponding to an output signal QI from the I/O circuit in a period T3 in which the signal ENB is set at the second voltage level.

17 Claims, 16 Drawing Sheets

U.S. PATENT DOCUMENTS

| | | | |
|---|---|---|---|
| 6,600,198 B2 * | 7/2003 | Ohnakado et al. | 257/357 |
| 6,621,297 B2 | 9/2003 | Watanabe | |
| 2003/0117206 A1 * | 6/2003 | Ohnakado | 327/310 |
| 2004/0109271 A1 * | 6/2004 | Takeda | 361/56 |

* cited by examiner

| D7~D0 | COMMAND |
|---|---|
| 00h | CMD0 |
| 01h | CMD1 |
| 02h | CMD2 |
| ⋮ | ⋮ |
| FFh | — |

FIG. 8A
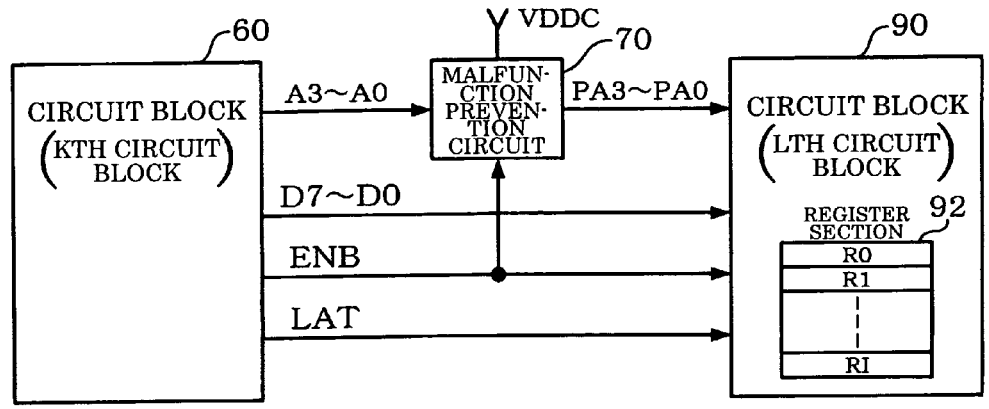
FIG. 8B
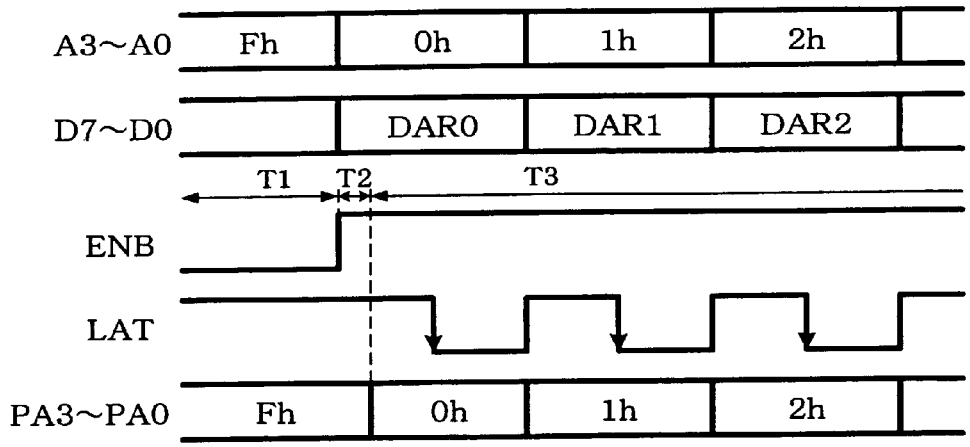
FIG. 8C
| A3~A0 | REGISTER | ADJUSTMENT DATA |
|---|---|---|
| 0h | R0 | DAR0 (VDDH) |
| 1h | R1 | DAR1 (VDDL) |
| 2h | R2 | DAR2 (VCOMH) |
| ⋮ | ⋮ | ⋮ |
| Fh | — | — |

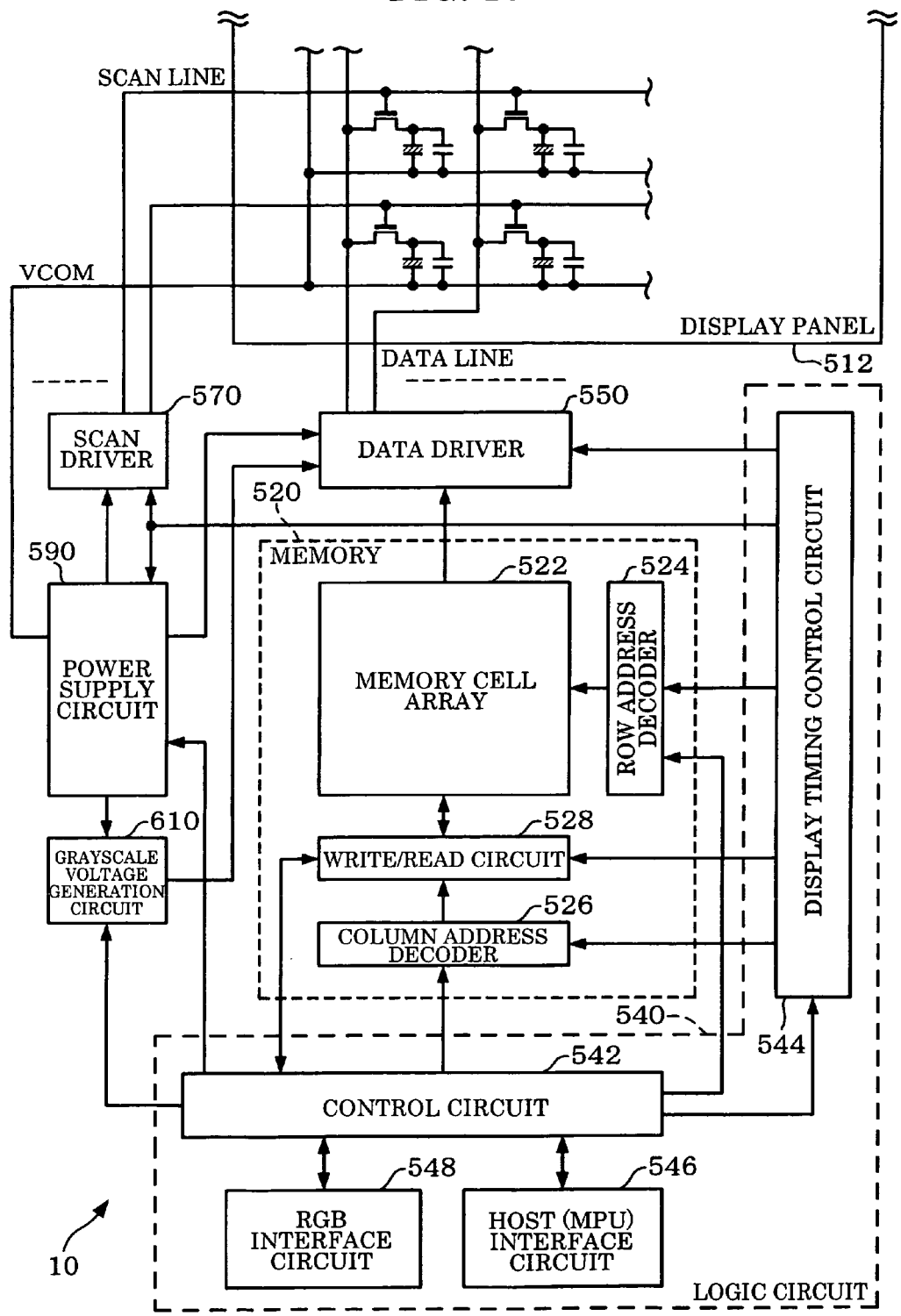

INTEGRATED CIRCUIT DEVICE AND ELECTRONIC INSTRUMENT

Japanese Patent Application No. 2005-296362 filed on Oct. 11, 2005, and Japanese Patent Application No. 2006-170946 filed on Jun. 21, 2006, are hereby incorporated by reference in their entirety.

BACKGROUND OF THE INVENTION

The present invention relates to an integrated circuit device and an electronic instrument.

When an electronic instrument such as a portable telephone is subjected to electrostatic discharge from the electrified operator, a transistor of an integrated circuit device provided in the electronic instrument may be destroyed due to static electricity. In order to prevent such electrostatic destruction, an electrostatic destruction protection element is provided in the integrated circuit device.

A malfunction such as an abnormal display on a display panel of the electronic instrument may occur due to electrostatic discharge from the operator, even if electrostatic destruction of the transistor does not occur. An electrostatic discharge (ESD) immunity test may be performed in order to inspect for such a malfunction caused by electrostatic discharge.

The ESD immunity test is used for an electronic instrument which is subjected to electrostatic discharge directly from the electrified operator or applied through an object close to the electronic instrument.

In recent years, insufficient ESD immunity has posed a problem along with advancement of a microfabrication process for integrated circuit devices. Therefore, provision of an integrated circuit device has been demanded which does not malfunction even if an electronic instrument is subjected to electrostatic discharge (JP-A-2003-234647).

SUMMARY

According to one aspect of the present invention, there is provided an integrated circuit device comprising:

an I/O circuit which buffers and outputs an input signal from a pad when an enable signal is set at a second voltage level;

a circuit block to which an output signal from the I/O circuit is input; and a malfunction prevention circuit which outputs to the circuit block an output signal of which a voltage level is set by a first power supply in a first period in which the enable signal is set at a first voltage level and a second period including a period in which the enable signal changes from the first voltage level to the second voltage level, and outputs to the circuit block the output signal corresponding to the output signal from the I/O circuit in a third period subsequent to the second period in which the enable signal is set at the second voltage level.

According to another aspect of the present invention, there is provided an integrated circuit device comprising:

a Kth circuit block which outputs an output signal when an enable signal is set at a second voltage level;

an Lth circuit block to which the output signal from the Kth circuit block is input; and a malfunction prevention circuit which outputs to the Lth circuit block an output signal of which a voltage level is set by a first power supply in a first period in which the enable signal is set at a first voltage level and a second period including a period in which the enable signal changes from the first voltage level to the second voltage level, and outputs to the Lth circuit block an output signal corresponding to the output signal from the Kth circuit block in a third period subsequent to the second period in which the enable signal is set at the second voltage level.

According to a further aspect of the present invention, there is provided an electronic instrument comprising:

one of the above integrated circuit devices; and a display panel driven by the integrated circuit device.

BRIEF DESCRIPTION OF THE SEVERAL VIEWS OF THE DRAWING

FIGS. 8A, 8B, and 8C are also views illustrative of a method of providing a malfunction prevention circuit between circuit blocks.

FIG. 10 is a circuit configuration example of a display driver which is an integrated circuit device.

DETAILED DESCRIPTION OF THE EMBODIMENT

Figure 1A:
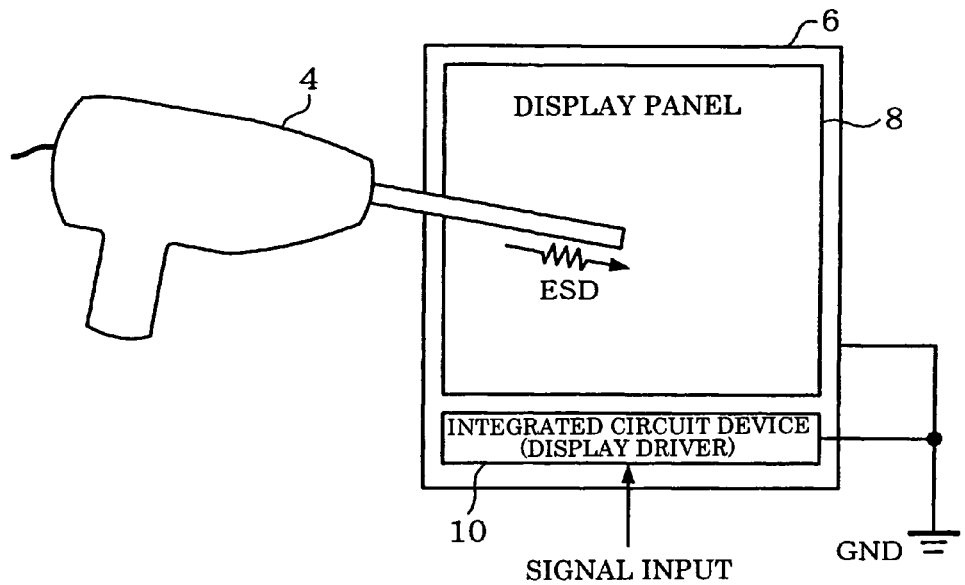
FIGS. 1A to 1D are views illustrative of ESD immunity.

The invention may provide an integrated circuit device which effectively prevents a malfunction due to electrostatic discharge or the like, and an electronic instrument including the integrated circuit device.

According to one embodiment of the invention, there is provided an integrated circuit device comprising:

an I/O circuit which buffers and outputs an input signal from a pad when an enable signal is set at a second voltage level;

a circuit block to which an output signal from the I/O circuit is input; and a malfunction prevention circuit which outputs to the circuit block an output signal of which a voltage level is set by a first power supply in a first period in which the enable signal is set at a first voltage level and a second period including a period in which the enable signal changes from the first voltage level to the second voltage level, and outputs to the circuit block the output signal corresponding to the output signal from the I/O circuit in a third period subsequent to the second period in which the enable signal is set at the second voltage level.

In this embodiment, the output signal from the I/O circuit is input to the circuit block through the malfunction prevention circuit. In this case, the output signal of which the voltage level is set by the first power supply is input to the circuit block in the first and second periods, and the output signal corresponding to the output signal from the I/O circuit is input to the circuit block in the third period. Therefore, even if noise is superposed on the power supply due to electrostatic discharge or the like, since the voltage level of the output signal from the malfunction prevention circuit is maintained at the voltage level of the first power supply, a malfunction of the integrated circuit device or an electronic instrument in which the integrated circuit device is incorporated can be prevented.

In the integrated circuit device according to this embodiment, the malfunction prevention circuit may include:

a signal processing circuit which receives the enable signal and outputs a signal obtained by subjecting the enable signal to at least one of signal delay processing and filter processing as a second enable signal; and a selector to which a voltage level of the first power supply is input at a first input and the output signal from the I/O circuit is input at a second input and which selects one of the first and second inputs based on the second enable signal and outputs an output signal.

This allows the first input of the selector to be selected in the second period including the transition period of the enable signal, whereby the output signal of which the voltage level is set by the first power supply is input to the circuit block.

In the integrated circuit device according to this embodiment, the first power supply may be a power supply differing from a power supply supplied to the I/O circuit.

This allows the output signal of which the voltage level is set by the stable first power supply to be input to the circuit block, even if noise or the like is superposed on the power supply supplied to the I/O circuit.

The integrated circuit device according to this embodiment may comprise:

first to Jth I/O circuits which buffer and output first to Jth input signals from first to Jth pads when the enable signal is set at the second voltage level; and first to Jth malfunction prevention circuits which output to the circuit block first to Jth output signals of which voltage levels are set by the first power supply in the first and second periods, and output to the circuit block the first to Jth output signals corresponding to the output signals from the first to Jth I/O circuits in the third period.

This prevents a situation for all the first to Jth input signals in which an erroneous signal is input to the circuit block due to noise caused by electrostatic discharge or the like.

In the integrated circuit device according to this embodiment, when respective commands for the integrated circuit device are assigned to respective combinations of signal levels of the first to Jth input signals from the first to Jth pads, the first to Jth malfunction prevention circuits may output to the circuit block the first to Jth output signals of which the combination of the signal levels is not assigned to the command in the first and second periods.

This allows the first to Jth output signals of which the combination is not assigned to the command to be input to the circuit block in the first and second periods, whereby the frequency that the command is erroneously written can be reduced.

According to another embodiment of the invention, there is provided an integrated circuit device comprising:

a Kth circuit block which outputs an output signal when an enable signal is set at a second voltage level;

an Lth circuit block to which the output signal from the Kth circuit block is input; and a malfunction prevention circuit which outputs to the Lth circuit block an output signal of which a voltage level is set by a first power supply in a first period in which the enable signal is set at a first voltage level and a second period including a period in which the enable signal changes from the first voltage level to the second voltage level, and outputs to the Lth circuit block an output signal corresponding to the output signal from the Kth circuit block in a third period subsequent to the second period in which the enable signal is set at the second voltage level.

In this embodiment, the output signal from the Kth circuit block is input to the Lth circuit block through the malfunction prevention circuit. In this case, the output signal of which the voltage level is set by the first power supply is input to the Lth circuit block in the first and second periods, and the output signal corresponding to the output signal from the Lth circuit block is input to the circuit block in the third period. Therefore, even if noise is superposed on the power supply due to electrostatic discharge or the like, since the voltage level of the output signal from the malfunction prevention circuit is maintained at the voltage level of the first power supply, a malfunction of the integrated circuit device or an electronic instrument in which the integrated circuit device is incorporated can be prevented.

In the integrated circuit device according to this embodiment, the Kth circuit block may be a logic circuit block; and the Lth circuit block may be a power supply circuit block which is controlled by the logic circuit block and generates a power supply voltage.

This prevents a situation in which the power supply circuit block generates an erroneous power supply voltage, for example.

In the integrated circuit device according to this embodiment, the Kth circuit block may be a logic circuit block; and the Lth circuit block may be a grayscale voltage generation circuit block which is controlled by the logic circuit block and generates grayscale voltages.

This prevents a situation in which the grayscale voltage generation circuit block generates erroneous grayscale voltages to cause the display characteristics to deteriorate, for example.

In the integrated circuit device according to this embodiment, the malfunction prevention circuit may include:

a signal processing circuit which receives the enable signal and outputs a signal obtained by subjecting the enable signal to at least one of signal delay processing and filter processing as a second enable signal; and a selector to which a voltage level of the first power supply is input at a first input and the output signal from the Kth circuit block is input at a second input and which selects one of the first and second inputs based on the second enable signal and outputs an output signal.

This allows the first input of the selector to be selected in the second period including the transition period of the enable signal, whereby the output signal of which the voltage level is set by the first power supply is input to the Lth circuit block.

In the integrated circuit device according to this embodiment, the Kth circuit block may output an address signal, a data signal, and the enable signal to the Lth circuit block; and the malfunction prevention circuit may output to the Lth circuit block an address signal of which a voltage level is set by the first power supply in the first and second periods, and may output to the Lth circuit block an address signal corresponding to the address signal from the Kth circuit block in the third period.

This prevents a situation in which a malfunction occurs due to an erroneous address signal setting.

In the integrated circuit device according to this embodiment, the malfunction prevention circuit may output to the Lth circuit block an address signal which is not assigned in a normal operation mode in the first and second periods as the address signal of which the voltage level is set by the first power supply.

This reduces the frequency of erroneous writing.

In the integrated circuit device according to this embodiment, the Kth circuit block may output an address signal, a data signal, and the enable signal to the Lth circuit block; and the malfunction prevention circuit may output to the Lth circuit block a data signal of which a voltage level is set by the first power supply in the first and second periods, and may output to the Lth circuit block a data signal corresponding to the data signal from the Kth circuit block in the third period.

This prevents a situation in which data of an erroneous data signal is transferred to the Lth circuit block to cause a malfunction.

The integrated circuit device according to this embodiment, may comprise:

first to Nth circuit blocks disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

the first to Nth circuit blocks may include the Kth circuit block and the Lth circuit block ($1 \leq K \leq L \leq N$); and another circuit block may be disposed between the Kth circuit block and the Lth circuit block.

In this embodiment, since the first to Nth circuit blocks are disposed along the first direction, a narrow integrated circuit device can be provided. In this embodiment, even if another circuit block is disposed between the Kth and Lth circuit blocks so that the Kth and Lth circuit blocks are disposed at a large distance, a malfunction is prevented by the malfunction prevention circuit. Therefore, a narrow integrated circuit device can be realized while preventing a malfunction.

According to a further embodiment of the invention, there is provided an electronic instrument comprising:

one of the above integrated circuit devices; and a display panel driven by the integrated circuit device.

Preferred embodiments of the invention are described below in detail. Note that the embodiments described hereunder do not in any way limit the scope of the invention defined by the claims laid out herein. Note that all elements of the embodiments described below should not necessarily be taken as essential requirements for the invention.

1. ESD Immunity

FIG. 1A conceptually shows an ESD immunity test for a display module 6 (electronic instrument in a broad sense) provided with a display panel 8 and an integrated circuit device 10 (display driver). Various signals and a power supply are supplied to the integrated circuit device 10 which drives the display panel 8 so that the integrated circuit device 10 is in an operating state. In this state, static electricity is applied to the display module 6 using a static electricity application device 4. In more detail, an operation of applying a positive static electricity test voltage (X kV) followed by removing the electricity is repeatedly performed a plurality of times (e.g. ten times). Then, an operation of applying a negative static electricity test voltage (−X kV) followed by removing the electricity is repeatedly performed a plurality of times (e.g. ten times). When the display module 6 has cleared the test using these operations, the test voltage (X kV) is increased by 1 kV, for example, and the same test is performed.

Figure 1B:
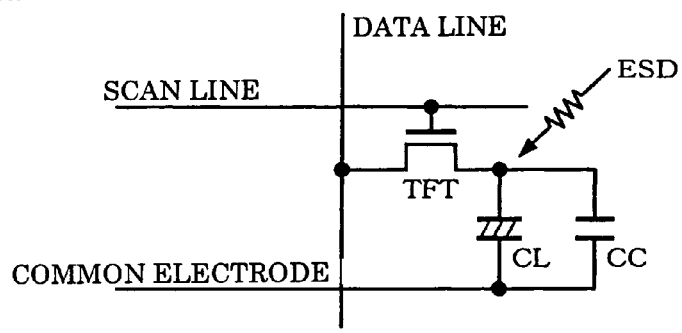

When the static electricity test voltage is applied, as shown in FIG. 1A, inductive charges generated in a glass substrate, a liquid crystal capacitor CL, or the like of the display panel 8 are discharged to the GND side, as shown in FIG. 1B. In more detail, inductive charges are discharged to the GND side through a data line, a scan line, a common electrode, and the integrated circuit device 10. This causes the integrated circuit device 10 to malfunction, whereby a problem occurs such as an abnormal display on the display panel 8.

Figure 1C:
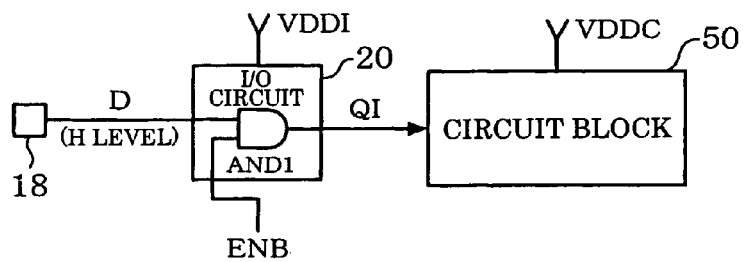
Figure 1D:

In FIG. 1C, when an enable signal is set at a high (H) level, an input/output (I/O) circuit 20 buffers a data signal D (input signal in a broad sense) from a pad 18, and outputs the data signal D to an internal circuit block 50, for example. The voltage level of the data signal D is fixed at the H level during the ESD immunity test, for example. When the static electricity test voltage is applied in this state, noise is superposed on a power supply VDDI of the I/O circuit 20, as shown in FIG. 1D. As a result, the data signal D set at the H level passes through a circuit AND1 of the I/O circuit 20 even if the enable signal is not set at the H level (active), whereby an erroneous data signal is input to the circuit block 50. For example, when a software reset command is assigned to the combination of the signal levels of the data signals D7 to D0 (e.g. 00000001=01h), the software reset command is erroneously written. This resets the integrated circuit device 10, whereby an abnormal state occurs in which an image is not displayed on the display panel 8. For example, when an electrified operator touches the screen of a portable telephone, an abnormal state due to ESD occurs in which an image is not displayed on the display panel. In order to recover from the abnormal state, it is necessary to again input a power supply ON command or the like to perform a normal start-up sequence, whereby convenience is impaired.

2. Malfunction Prevention Circuit

Figure 2A:
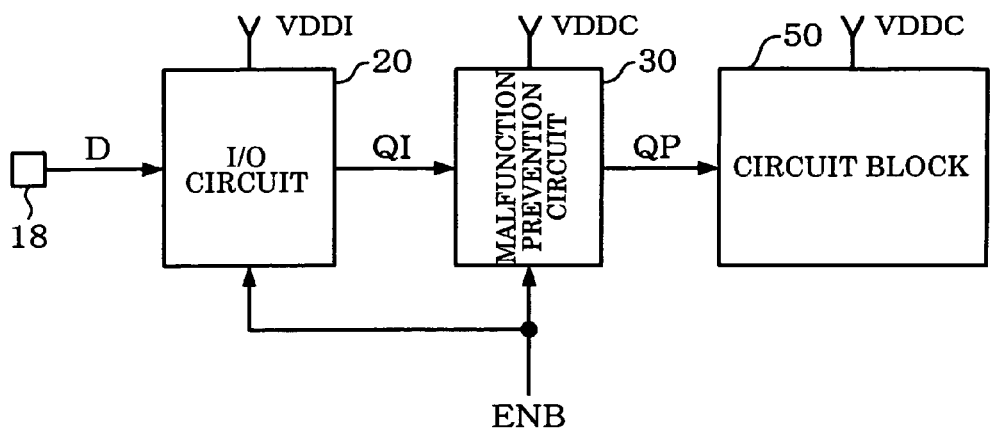
FIGS. 2A, 2B, and 2C are views showing a configuration example of an integrated circuit device according to one embodiment of the invention and are views illustrative of the integrated circuit device.

FIG. 2A shows a configuration example of an integrated circuit device according to this embodiment which can solve the above-described problem. As shown in FIG. 2A, the integrated circuit device includes the input/output (I/O) circuit 20, a malfunction prevention circuit 30, and the circuit block 50.

When an enable signal ENB (input control signal) is set at the H level (second voltage level in a broad sense), the I/O circuit 20 buffers the data signal D (input signal) from the pad 18 (electrode) and outputs an output signal QI. It suffices that the I/O circuit 20 (I/O cell) include at least an input buffer circuit. The I/O circuit 20 may be an I/O circuit for input only, or may be an I/O circuit for both input and output.

The circuit block 50 is an internal circuit of the integrated circuit device. The output signal QI (QP) from the I/O circuit 20 is input to the circuit block 50. As an example of the circuit block 50, a logic circuit block formed by an automatic routing method, such as a gate array (G/A), can be given.

Figure 2B:
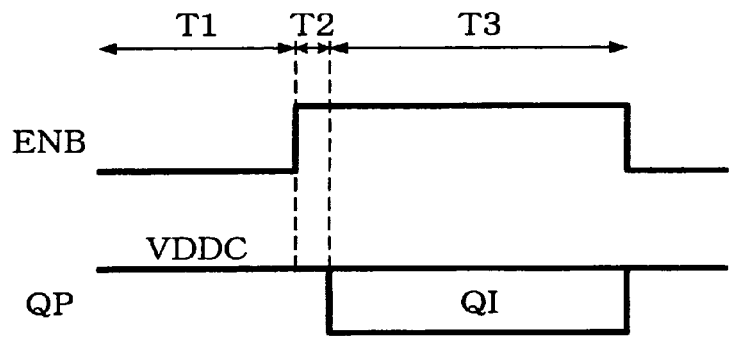

The malfunction prevention circuit 30 is a circuit which prevents a malfunction due to external noise such as static electricity. As shown in FIG. 2B, in a period T1 in which the enable signal is set at the low (L) level (first voltage level in a broad sense), the malfunction prevention circuit 30 outputs the output signal QP of which the voltage level is set by the power supply VDDC (first power supply in a broad sense) to the circuit block 50. In a period T2 (period subsequent to the period T1) including a transition period in which the enable signal ENB changes from the L level (first voltage level) to the H level (second voltage level), the malfunction prevention circuit 30 outputs the output signal QP of which the voltage level is set by the power supply VDDC to the circuit block 50. For example, the malfunction prevention circuit 30 outputs to the circuit block 50 the output signal QP set at the H level which is the voltage level of the power supply VDDC. The period T2 is a given time period (delay time due to delay element) from the timing at which the signal ENB changes from the L level to the H level, for example. In FIGS. 2A and 2B, the malfunction prevention circuit 30 outputs the output signal QP set at the H level in the periods T1 and T2. Note that the malfunction prevention circuit 30 may output the output signal QP set at the L level.

In a period T3 subsequent to the period T2 in which the enable signal ENB is set at the H level, the malfunction prevention circuit 30 outputs to the circuit block 50 the output signal QP corresponding to the output signal QI from the I/O circuit 20. For example, the malfunction prevention circuit 30 outputs the output signal QP set at the L level when the output signal QI is set at the L level, and outputs the output signal QP set at the H level when the output signal QI is set at the H level. The malfunction prevention circuit 30 may output the inversion signal of the voltage level of the signal QI as the signal QP. In this case, the I/O circuit 20 may output the inversion signal of the signal D. The malfunction prevention circuit 30 may be a circuit included in the I/O circuit 20 or the circuit block 50. The enable signal ENB may be a negative-logic signal.

Figure 2C:
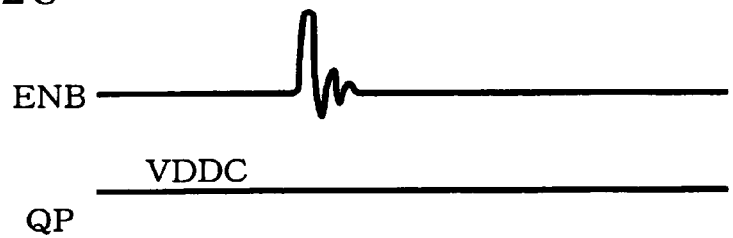

Even if noise is superposed on the power supply VDDI due to ESD or the like, as shown FIG. 1D, the voltage level of the output signal QP from the malfunction prevention circuit 30 is maintained at the voltage level (H level) of the power supply VDDC. Specifically, even if the relative voltage level of the signal ENB transitionally changes, as shown in FIG. 2C, the malfunction prevention circuit 30 prevents the circuit block 50 from being affected by the transitional change in the voltage level. Therefore, a situation is prevented in which a command/parameter such as a software reset command is erroneously written due to noise such as an external surge, for example. As a result, an integrated circuit device and an electronic instrument with a high ESD immunity can be provided.

In FIG. 2A, the power supply VDDC supplied to the malfunction prevention circuit 30 differs from the power supply VDDI supplied to the I/O circuit 20. Therefore, even if noise is superposed on the power supply VDDI due to ESD, as shown in FIG. 11D, the signal QP can be set at a stable voltage level of the power supply VDDC, whereby a malfunction can be more reliably prevented. In FIG. 2A, the power supply VDDC is the power supply for the circuit block 50. The circuit block 50 includes a number of transistors, and source capacitors or the like of the transistors are parasitic to the power supply VDDC. Therefore, noise superposed on the power supply VDDC is reduced in comparison with the power supply VDDI when ESD is applied, whereby the signal QP can be set at a more stable voltage level. Note that the power supply supplied to the I/O circuit 20 may be supplied to the malfunction prevention circuit 30.

3. Detailed Configuration

Figure 3A:
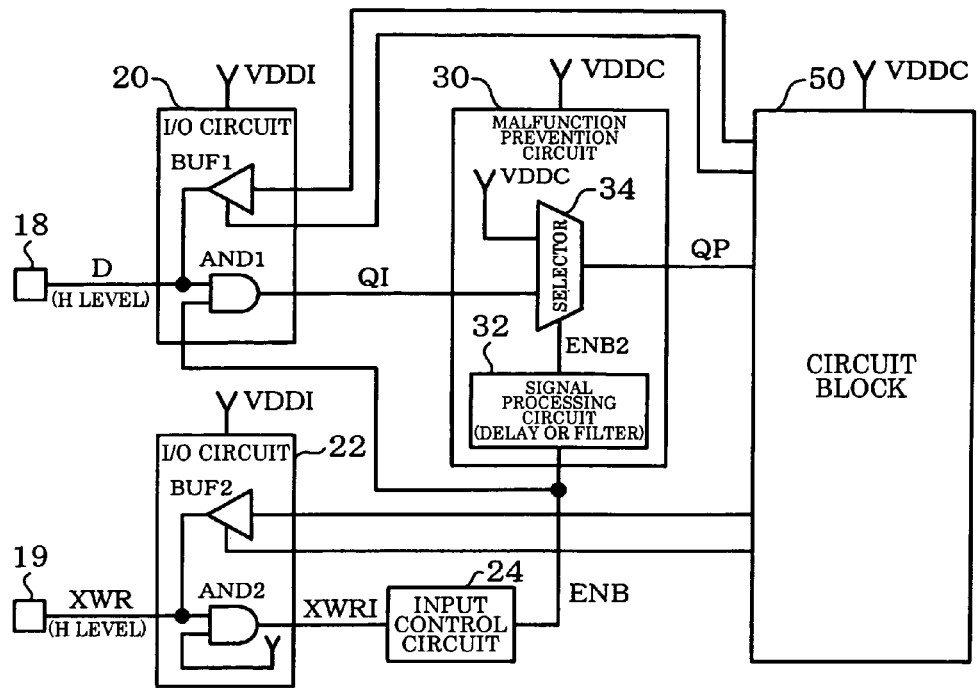
FIGS. 3A, 3B, and 3C are views showing a detailed configuration example of the integrated circuit device and are views illustrative of the integrated circuit device.

FIG. 3A shows a detailed configuration example of the I/O circuits 20 and 22 and the malfunction prevention circuit 30. The configuration of the I/O circuit and the malfunction prevention circuit is not limited to the configuration shown in FIG. 3A. Various modifications and variations may be made such as omitting some of the elements shown in FIG. 3A or adding another element.

The I/O circuits 20 and 22 respectively include buffer circuits BUF1 and BUF2 which function as output buffers. The I/O circuits 20 and 22 also respectively include circuits AND1 and AND2 which function as input buffers. The I/O circuits 20 and 22 are I/O circuits for both input and output. Note that a configuration may also be employed in which the circuits BUF1 and BUF2 are not provided in the I/O circuits 20 and 22.

Figure 4A:
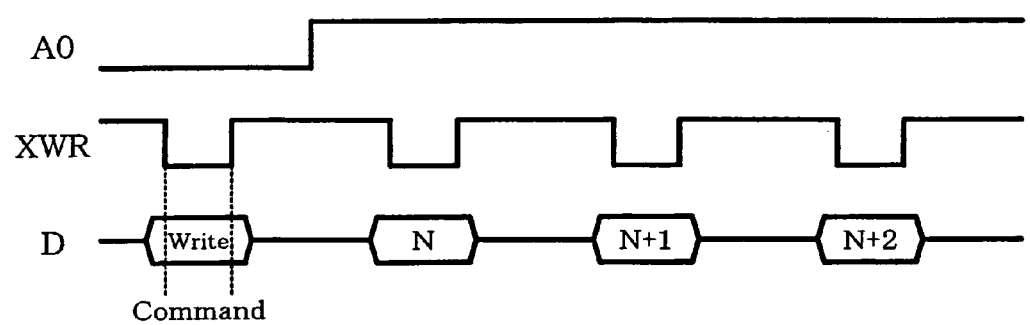
FIGS. 4A and 4B show signal waveform examples of a host (MPU) interface.
Figure 4B:
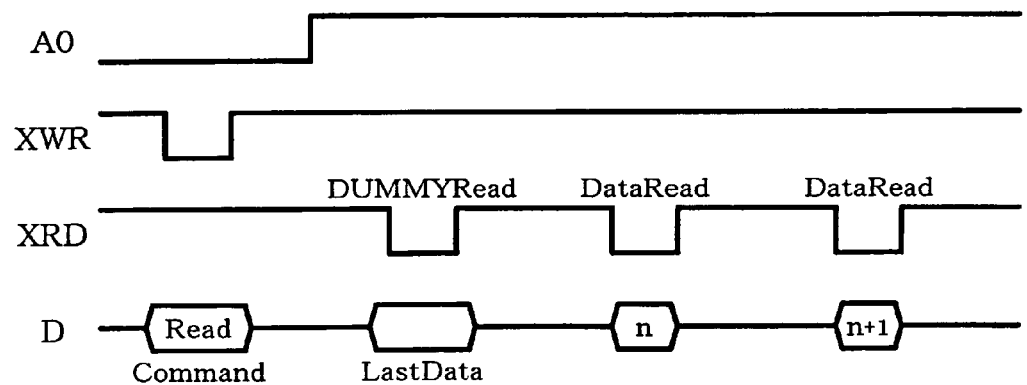

FIGS. 4A and 4B show signal waveform examples of a host (MPU) interface. A host device (external device) such as an MPU, baseband engine, or image processor inputs the data signal D (e.g. 8-bit signal) to the integrated circuit device (display driver) using a write signal XWR ("X" indicates negative logic), as shown in FIG. 4A. Specifically, the host device writes a command using the signal D by setting a signal A0 (command/parameter identification signal) at the L level and setting the write signal XWR at the L level. The host device then writes a parameter (data) of the command using the signal D by setting the signal A0 at the H level and setting the write signal XWR at the L level. The command and the parameter are written into a register (register or bus holder included in the circuit block 50) provided in the integrated circuit device at the rising edge of the write signal XWR. A read operation from the integrated circuit device is performed using a read signal XRD, as shown in FIG. 4B.

The I/O circuit 22 buffers and outputs the write signal XWR. An input control circuit 24 generates the enable signal ENB based on a signal XWRI from the I/O circuit 22. The enable signal ENB is a signal for controlling the input of the I/O circuit 20. The input of the I/O circuit 20 is enabled when the signal ENB is set at the H level (active).

The circuit AND1 of the I/O circuit 20 buffers the data signal D from the pad 18 when the signal ENB is set at the H level, and outputs the data signal D as the output signal QI. In this case, the output of the circuit BUF1 is set in a high impedance state.

Figure 3B:
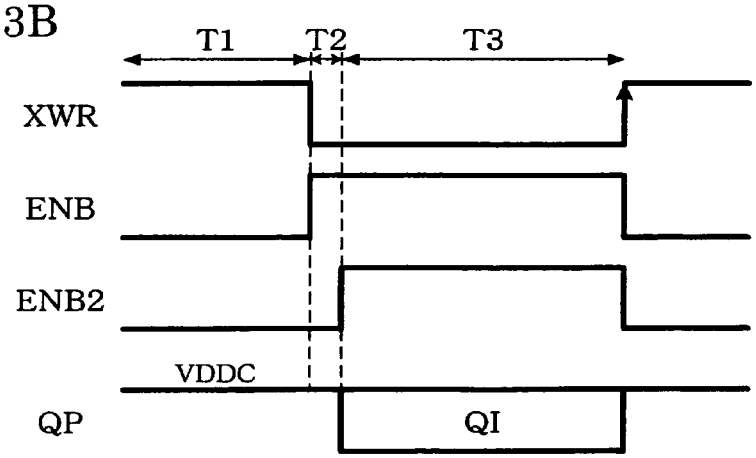
Figure 3C:
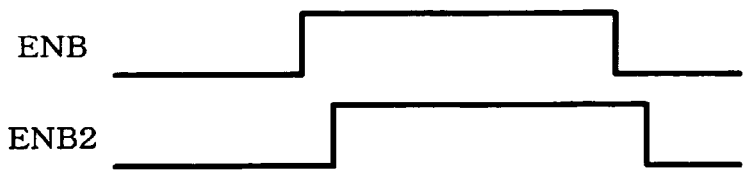

The malfunction prevention circuit 30 includes a signal processing circuit 32 and a selector 34. The signal processing circuit 32 receives the enable signal ENB, and outputs a signal obtained by subjecting the signal ENB to signal delay processing or filter processing as a second enable signal ENB2. FIGS. 3B and 3C show examples of the signal ENB2 output from the signal processing circuit 32. In FIG. 3B, the signal ENB2 is generated by performing the signal delay processing only at the rising edge of the signal ENB. In FIG. 3C, the signal ENB2 is generated by performing the signal delay processing at the rising edge and the falling edge of the signal ENB. The signal processing circuit 32 may perform only one of the signal delay processing and the filter processing, or may perform both the signal delay processing and the filter processing.

The voltage level of the power supply VDDC is input to a first input of the selector 34, and the output signal QI from the I/O circuit 20 is input to a second input of the selector 34. The selector 34 selects the first or second input based on the enable signal ENB2, and outputs the output signal QP. In FIG. 3B, the signal ENB2 is set at the L level (first voltage level) in the periods T1 and T2, whereby the first input of the selector 34 is selected, for example. Therefore, the selector 34 outputs the output signal QP set at the voltage level of the power supply VDDC.

The signal ENB2 is set at the H level (second voltage level) in the period T3, whereby the second input of the selector 34 is selected. Therefore, the selector 34 outputs the signal QI from the I/O circuit 20 as the signal QP. This prevents a situation in which an erroneous signal is input to the circuit block 50 due to an external surge or the like to cause a malfunction to occur.

Figure 5A:
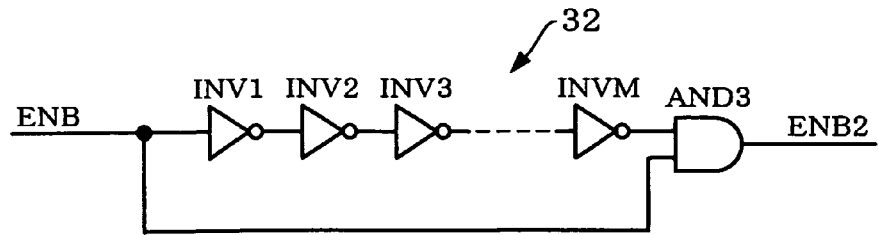
FIGS. 5A to 5D show configuration examples of a signal processing circuit and a selector.
Figure 5B:
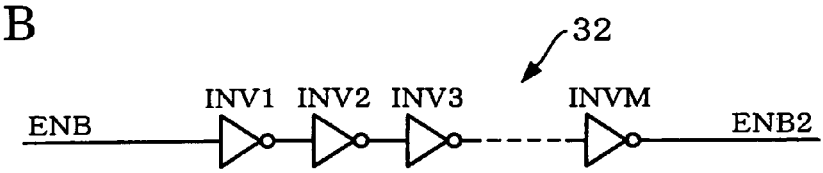

FIG. 5A shows a configuration example of the signal processing circuit 32. The signal processing circuit 32 includes inverter circuits INV1 to INVM forming a delay circuit, and a circuit AND3. The output from the circuit INVM is input to a first input of the circuit AND3, and the signal ENB is output to a second input of the circuit AND3. The signal ENB2 shown in FIG. 3B can be generated by employing the configuration shown in FIG. 5A. The signal ENB2 shown in FIG. 3B is delayed at the rising edge for several nanoseconds (e.g. 2 ns), but is delayed at the falling edge to only a small extent. Therefore, when writing a signal into the register of the circuit block 50 at the rising edge of the signal XWR (falling edge of the signal ENB), as shown in FIG. 4A, adverse effects of the holding time and the setup time of writing on the AC characteristics can be minimized. The signal processing circuit 32 may have a configuration shown in FIG. 5B. In this case, the signal ENB2 shown in FIG. 3C is generated. The signal processing circuit 32 may be a signal delay circuit (signal delay and filter circuit) as shown in FIGS. 5A and 5B, or may be a filter circuit realized using a resistor element and a capacitor.

Figure 5C:
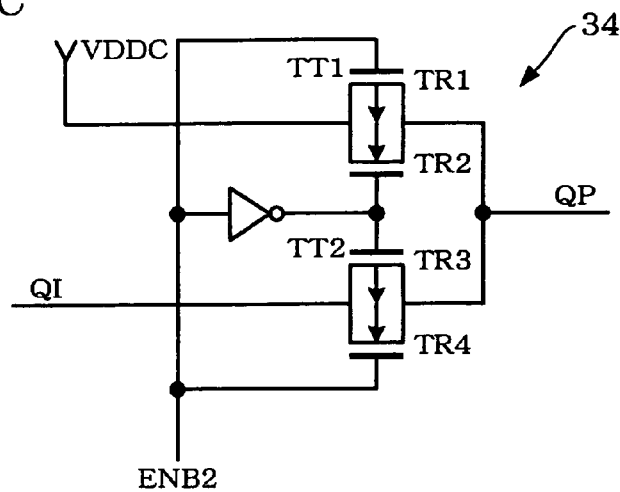
Figure 5D:
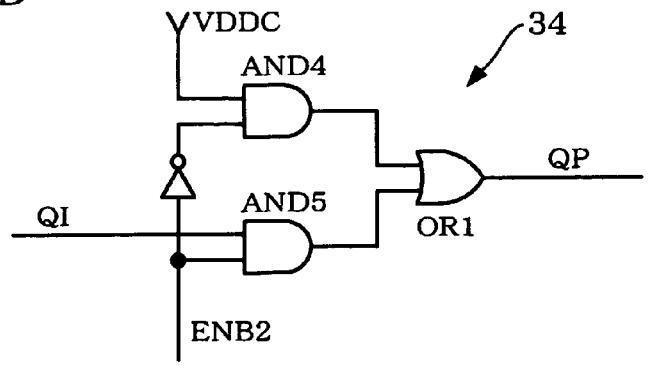

FIG. 5C shows a configuration example of the selector 34. The selector 34 shown in FIG. 5C includes a transfer transistor TT1 including transistors TR1 and TR2, and a transfer transistor TT2 including transistors TR3 and TR4. The transfer transistor TT1 is turned ON when the signal ENB2 is set at the L level, and the transfer transistor TT2 is turned ON when the signal ENB2 is set at the H level. The selector 34 may have a configuration shown in FIG. 5D. The selector 34 shown in FIG. 5D includes circuits AND4 and AND5 and a circuit OR1.

4. Command Assignment

Figures 6A, 6B:
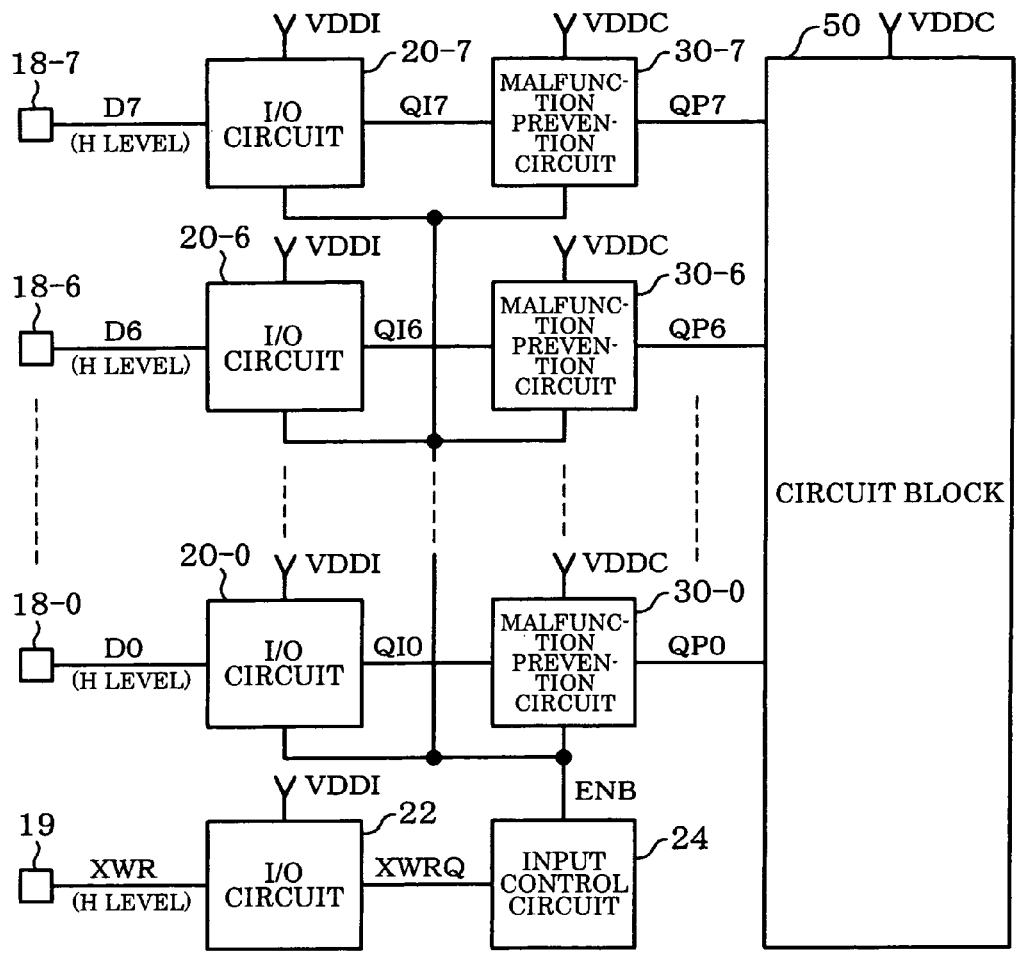
FIGS. 6A and 6B are views showing a configuration example of the integrated circuit device and illustrative of the integrated circuit device.

The malfunction prevention circuit 30 may be provided for only some bits of the data signal, or may be provided for all bits of the data signal. In FIG. 6A, the integrated circuit device includes I/O circuits 20-7 to 20-0 (first to Jth I/O circuits in a broad sense) and malfunction prevention circuits 30-7 to 30-0 (first to Jth malfunction prevention circuits in a broad sense). The I/O circuits 20-7 to 20-0 respectively buffer and output the data signals D7 to D0 from pads 18-7 to 18-0 when the enable signal ENB is set at the H level. The malfunction prevention circuits 30-7 to 30-0 output to the circuit block 50 output signals QP7 to QP0 (first to Jth output signals in a broad sense) of which the voltage levels are set by the power supply VDDC in the periods T1 and T2. In the period T3, the malfunction prevention circuits 30-7 to 30-0 output to the circuit block 50 the output signals QP7 to QP0 corresponding to output signals QI7 to QI0 from the I/O circuits 20-7 to 20-0.

In FIG. 6A, the malfunction prevention circuits 30-7 to 30-0 are provided for all bits of the data signals D7 to D0. Therefore, a situation in which an erroneous signal is input to the circuit block 50 due to external noise such as ESD can be prevented for all the data signals D7 to D0.

In FIG. 4A, a command is input using the data signals D7 to D0 when the signal A0 is set at the L level. Specifically, each command (operation instruction command) for the integrated circuit device is assigned to the combination of the signal levels of the signals D7 to D0 (first to Jth input signals from the first to Jth pads), as shown in FIG. 6B. For example, a command CMD0 is input when the signals D7 to D0 are 00h, and a command CMD1 is input when the signals D7 to D0 are 01h. "h" means a hexadecimal notation. When the signal A0 is set at the H level, a parameter of a command is input using the signals D7 to D0.

In FIG. 6B, the command CMD0 is a software reset command. Therefore, when the malfunction prevention circuit is not provided, the software reset command may be erroneously written when ESD is applied. In this embodiment, since the malfunction prevention circuits 30-7 to 30-0 are provided, the signals QP7 to QP0 are fixed at the H level when ESD is applied, whereby the software reset command can be prevented from being erroneously written.

In the periods T1 and T2, it is preferable that the malfunction prevention circuits 30-7 to 30-0 output to the circuit block 50 the output signals QP7 to QP0 of which the combination of the signal levels is not assigned to a command. In FIG. 6B, no command is assigned to FFh, for example. Therefore, it is preferable that the malfunction prevention circuits 30-7 to 30-0 output the signals QP7 to QP0 of which the signal levels are (11111111)=(FFh) in the periods T1 and T2. This further reduces the frequency that the software reset command is erroneously written.

The voltage levels of the data signals D7 to D0 may be set at the H level during the ESD immunity test or during standby in the normal operation. In this case, it is preferable that the malfunction prevention circuits 30-7 to 30-0 set the voltage levels of the signals QP7 to QP0 at the H level to output the signals QP7 to QP0 set at FFh in the periods T1 and T2. When the voltage levels of the data signals D7 to D0 are set at the L level during the ESD immunity test or the like, it is preferable that the malfunction prevention circuits 30-7 to 30-0 set the voltage levels of the signals QP7 to QP0 at the L level in the periods T1 and T2.

5. Malfunction Prevention Circuit Between Circuit Blocks

Figure 7A:
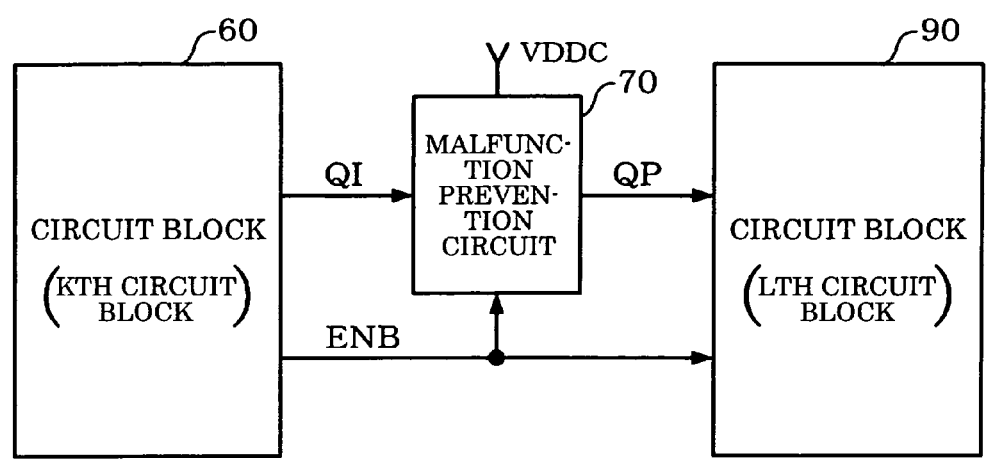
FIGS. 7A and 7B are views illustrative of a method of providing a malfunction prevention circuit between circuit blocks.

The malfunction prevention circuit may be provided between circuit blocks. In FIG. 7A, the integrated circuit device includes a circuit block 60 (Kth circuit block) which outputs an effective output signal QI when the enable signal ENB is set at the H level (second voltage level), a circuit block 90 (Lth circuit block) to which the output signal from the circuit block 60 is input, and a malfunction prevention circuit 70, for example. Note that the malfunction prevention circuit 70 may be included in the circuit block 60 or 90.

Figure 7B:
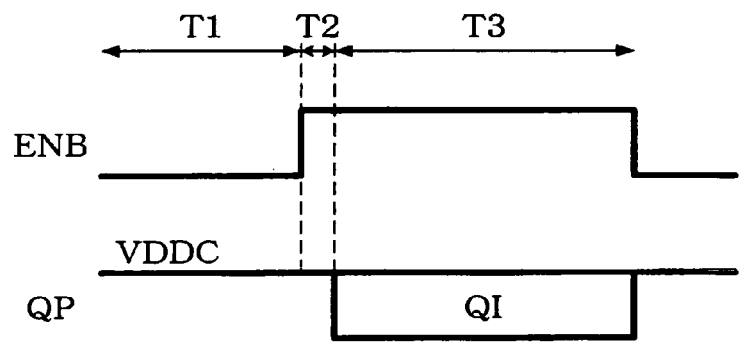

As shown in FIG. 7B, the malfunction prevention circuit 70 outputs to the circuit block 90 the output signal QP of which the voltage level is set by the power supply VDDC in the period T1 in which the signal ENB is set at the L level (first voltage level) and the period T2 including a period in which the signal ENB changes from the L level to the H level. In the period T3 subsequent to the period T2 in which the signal ENB is set at the H level, the malfunction prevention circuit 70 outputs to the circuit block 90 the output signal QP corresponding to the output signal QI from the circuit block 60.

This allows the voltage level of the output signal QP of the malfunction prevention circuit 70 to be maintained at the voltage level of the power supply VDDC, even if noise is superposed on the power supply when ESD or the like is applied. Therefore, a situation can be prevented in which a command is erroneously written due to noise such as an external surge, whereby the ESD immunity can be increased.

For example, the circuit block 60 shown in FIG. 7A is a logic circuit block (G/A), and the circuit block 90 is a power supply circuit block which is controlled by the logic circuit block and generates a power supply. Or, the circuit block 90 is a grayscale voltage generation circuit block which is controlled by the logic circuit block and generates a grayscale voltage. Voltage adjustment data or grayscale adjustment data is transferred between the logic circuit block and the power supply circuit block or the grayscale voltage generation circuit block. Therefore, when noise is superposed on the communication signal due to ESD or the like, erroneous voltage adjustment data or grayscale adjustment data is written into the power supply circuit block or the grayscale voltage generation circuit block, whereby a malfunction occurs. In particular, when the distance between the logic circuit block and the power supply circuit block or the grayscale voltage generation circuit block is long, noise is easily superposed on the communication signal, whereby a malfunction easily occurs. On the other hand, such a malfunction can be prevented by providing the malfunction prevention circuit shown in FIG. 7A, whereby the ESD immunity can be increased.

FIG. 8A shows a detailed example of the circuit blocks 60 and 90 and the malfunction prevention circuit 70. The circuit block 60 outputs address signals A3 to A0, the data signals D7 to D0, and the enable signal ENB to the circuit block 90. The circuit block 60 also outputs a latch signal LAT. In more detail, the circuit block 60 outputs the address signals set at Fh (Mth address signal) and ineffective data signals D7 to D0 when the signal ENB is set at the L level (first voltage level). The circuit block 60 outputs effective data signals D7 to D0 when the signal ENB is set at the H level (second voltage level).

As shown in FIG. 8B, the malfunction prevention circuit 70 outputs to the circuit block 90 address signals PA3 to PA0 of which the voltage levels are set by the power supply VDDC in the periods T1 and T2. In more detail, the malfunction prevention circuit 70 outputs the signals PA3 to PA0 of which the combination of the signal levels is (1111)=(Fh). In the period T3, the malfunction prevention circuit 70 outputs to the circuit block 90 the address signals PA3 to PA0 corresponding to the address signals A3 to A0 from the circuit block 60. In more detail, the malfunction prevention circuit 70 buffers the signals A3 to A0 and outputs the signals A3 to A0 to the circuit block 90 as the signals PA3 to PA0.

In FIG. 8A, the circuit block 90 includes a register section 92 including a plurality of registers R0 to R1. In the register section 92, the adjustment data (voltage adjustment data or grayscale adjustment data) set using the data signals D7 to D0 is written into the register specified by the register address indicated by the address signals A3 to A0. In FIG. 8C, the registers R0, R1, R2, ... are assigned (mapped) to the register addresses (0h), (1h), (2h), ... indicated by the address signals A3 to A0, for example. Adjustment data DAR0, DAR1, DAR2, ... set using the data signals D7 to D0 is written into the registers R0, R1, R2, ... specified by the register addresses (0h), (1h), (2h), .... When the circuit block 90 is the power supply circuit block, the adjustment data DAR0, DAR1, and DAR2 serves as voltage adjustment (voltage setting) data for a plurality of power supplies VDDH, VDDL, and VCOMH generated by the power supply circuit block.

When signals are transferred between the circuit blocks 60 and 90 using the address signals A3 to A0 and the data signals D7 to D0, noise due to ESD or the like may cause erroneous adjustment data to be written into the registers R0 to R1. For example, when the signal ENB is set at the L level, the signals D7 to D0 are ineffective data signals. However, when the voltage level of the signal ENB transitionally changes due to noise caused by ESD, adjustment data set by the ineffective data signals may be written into the registers R0 to R1.

In FIG. 8A, the malfunction prevention circuit 70 is provided for the address signals A3 to A0. The malfunction prevention circuit 70 prevents the circuit block 90 from being affected by the transitional change in the voltage level. Therefore, a situation can be prevented in which the adjustment data is erroneously written due to noise caused by ESD, whereby the ESD immunity can be increased.

As shown in FIG. 8B, the malfunction prevention circuit 70 outputs to the circuit block 90 the address signals PA7 to PA0 of the register address (Fh) which is not assigned in the normal operation mode as the address signals of which the voltage levels are set by the power supply VDDC in the periods T1 and T2. In FIG. 8C, a register is not assigned (mapped) to the address signals (Fh), for example. The malfunction prevention circuit 70 outputs the address signals PA3 to PA0 of which the signal levels are (1111)=(Fh) in the periods T1 and T2. Specifically, the malfunction prevention circuit 70 sets all bits of the signals PA3 to PA0 at the H level which is the voltage level of the power supply VDDC. This further reduces the frequency that the adjustment data is erroneous written.

Figure 9A:
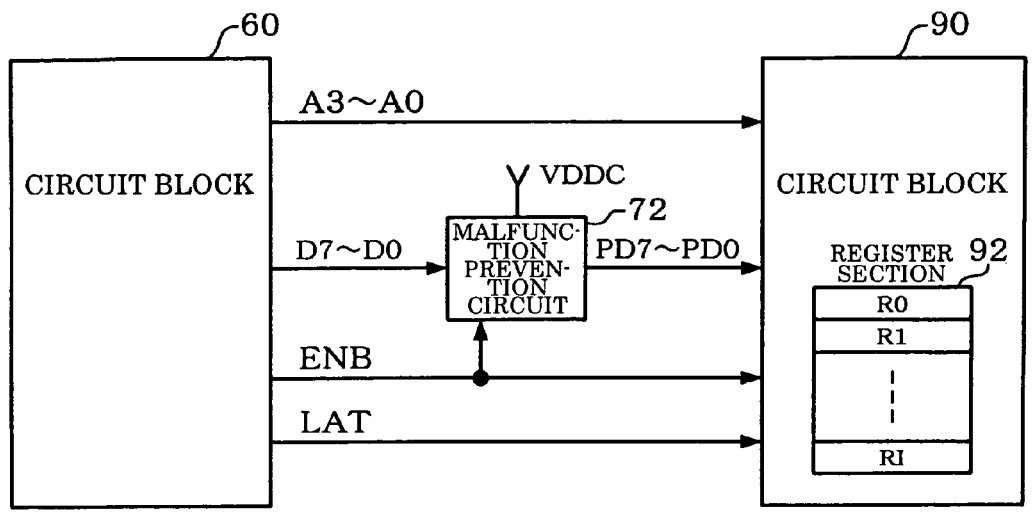
FIGS. 9A and 9B are views illustrative of a method of providing a malfunction prevention circuit for data signals.
Figure 9B:
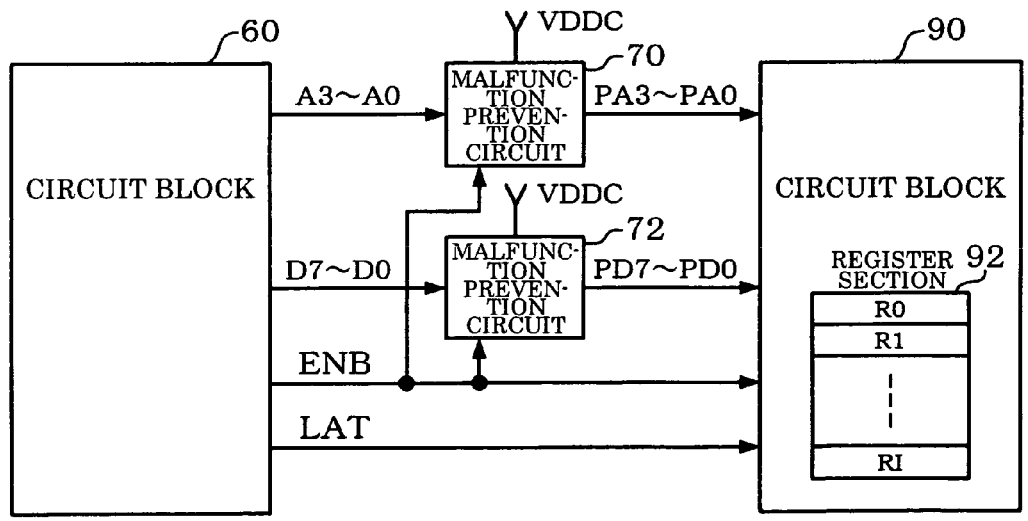

The malfunction prevention circuit 70 shown in FIG. 8A may include the signal processing circuit 32 and the selector 34 similar to those shown in FIG. 3A. The malfunction prevention circuit 70 may be provided for all bits of the address signals A3 to A0, or may be provided for only some bits of the address signals A3 to A0. Or, a malfunction prevention circuit 72 may be provided for the data signals D7 to D0, as shown in FIG. 9A. In this case, the malfunction prevention circuit 72 outputs to the circuit block 90 data signals PD7 to PD0 of which the voltage levels are set by the power supply VDDC in the periods T1 and T2, and outputs to the circuit block 90 the data signals PD7 to PD0 corresponding to the data signals D7 to D0 from the circuit block 60 in the period T3. Or, the malfunction prevention circuits 70 and 72 may be respectively provided for the address signals A3 to A0 and the data signals PD7 to PD0, as shown in FIG. 9B.

6. Circuit Configuration Example of Integrated Circuit Device

FIG. 10 shows a detailed circuit configuration example when the integrated circuit device according to this embodiment is a display driver. A display panel 512 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 512 may be formed of an active matrix type panel using a switching element such as a TFT or TFD. The display panel 512 may be a panel other than the active matrix type panel, or may be a panel (e.g. organic EL panel) other than the liquid crystal panel.

A memory 520 (RAM) stores image data. A memory cell array 522 includes a plurality of memory cells, and stores image data (display data) of at least one frame (one screen). The memory 520 includes a row address decoder 524 (MPU/LCD row address decoder), a column address decoder 526 (MPU column address decoder), and a write/read circuit 528 (MPU write/read circuit).

A logic circuit 540 generates a control signal for controlling the display timing or data processing timing. The logic circuit 540 may be formed by an automatic placement and routing method such as a gate array (G/A). A control circuit 542 generates various control signals and controls the entire device. A display timing control circuit 544 generates a display timing control signal, and controls reading image data from the memory 520 into the display panel 512. A host (MPU) interface circuit 546 generates an internal pulse each time accessed from a host to realize a host interface for accessing the memory 520. An RGB interface circuit 548 realizes an RGB interface of writing video RGB data into the memory 520 based on a dot clock signal.

The host (MPU) interface shown in FIGS. 4A and 4B is realized by the host interface circuit 546 shown in FIG. 10.

A data driver 550 is a circuit which generates a data signal for driving a data line of the display panel 512. In more detail, the data driver 550 receives grayscale data (image data) from the memory 520, and receives a plurality of (e.g. 64 stages) grayscale voltages (reference voltages) from a grayscale voltage generation circuit 610. The data driver 550 selects a voltage corresponding to the grayscale data from these grayscale voltages, and outputs the selected voltage to each data line of the display panel 512 as the data signal (data voltage).

A scan driver 570 is a circuit which generates a scan signal for driving a scan line of the display panel. In more detail, the scan driver 570 sequentially shifts a signal (enable input/output signal) using a shift register provided therein, and outputs a signal obtained by converting the level of the shifted signal to each scan line of the display panel 512 as the scan signal (scan voltage). A scan address generation circuit and an address decoder may be provided in the scan driver 570. The scan address generation circuit may generate and output a scan address, and the address decoder may decode the scan address to generate the scan signal.

Figure 11A:
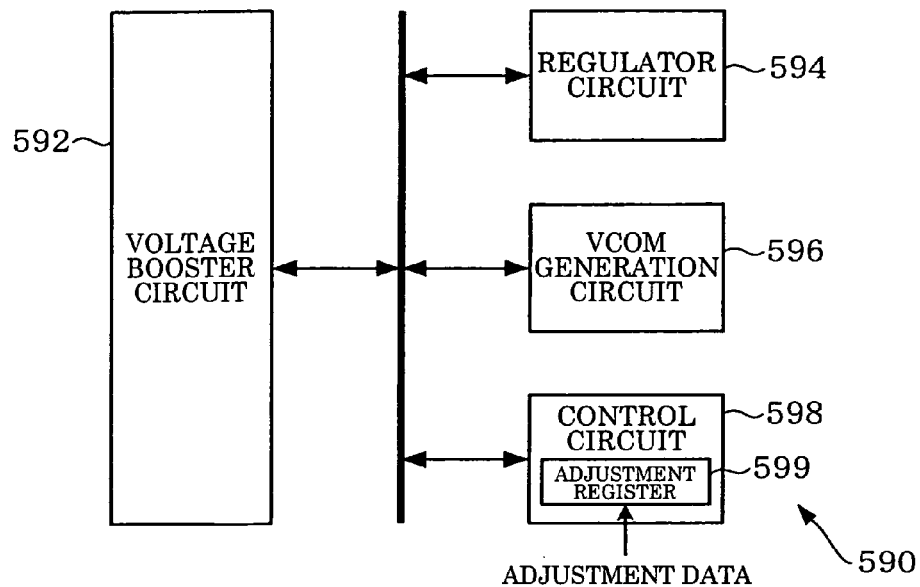
FIGS. 11A and 11B show configuration examples of a power supply circuit and a grayscale voltage generation circuit.

A power supply circuit 590 is a circuit which generates various power supply voltages. FIG. 11A shows a configuration example of the power supply circuit 590. A voltage booster circuit 592 is a circuit which generates a boost voltage by increasing an input power supply voltage or an internal power supply voltage by a charge-pump method using a boost transistor and a boost capacitor, and may include first to fourth voltage booster circuits and the like. A high voltage used by the scan driver 570 and the grayscale voltage generation circuit 610 can be generated by the voltage booster circuit 592. A regulator circuit 594 adjusts the level of the boost voltage generated by the voltage booster circuit 592. A VCOM generation circuit 596 generates and outputs a VCOM voltage supplied to the common electrode of the display panel. A control circuit 598 controls the power supply circuit 590, and includes an adjustment register 599 in which adjustment data for the power supply voltage is set.

Figure 11B:
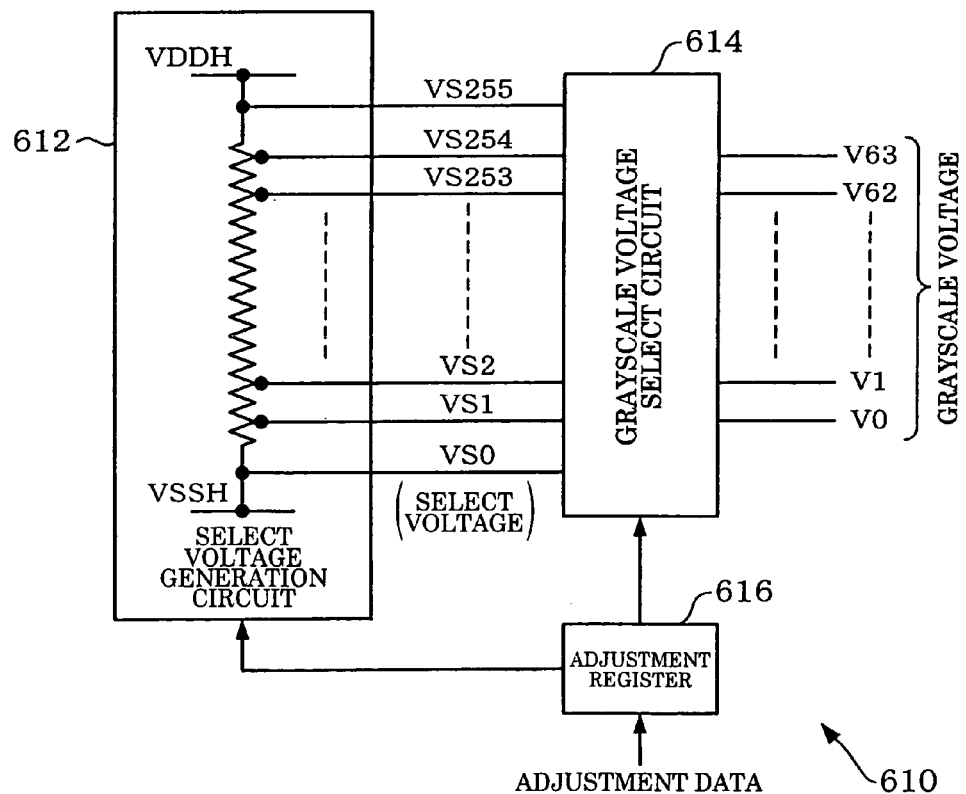

The grayscale voltage generation circuit (gamma correction circuit) 610 is a circuit which generates the grayscale voltage. FIG. 11B shows a configuration example of the grayscale voltage generation circuit 610. A select voltage generation circuit 612 (voltage divider circuit) outputs select voltages VS0 to VS255 (R select voltages in a broad sense) based on high-voltage power supply voltages VDDH and VSSH generated by the power supply circuit 590. In more detail, the select voltage generation circuit 612 includes a ladder resistor circuit including a plurality of resistor elements connected in series. The select voltage generation circuit 612 outputs voltages obtained by dividing the power supply voltages VDDH and VSSH using the ladder resistor circuit as the select voltages VS0 to VS255. When the number of grayscales is 64, a grayscale voltage select circuit 614 selects 64 (S in a broad sense; R>S) voltages from the select voltages VS0 to VS255 based on the grayscale characteristic adjustment data set in an adjustment register 616 by the logic circuit 540, and outputs the selected voltages as grayscale voltages V0 to V63. This allows generation of grayscale voltages with grayscale characteristics (gamma correction characteristics) optimum for the display panel.

7. Narrow Integrated Circuit Device

Figure 12:
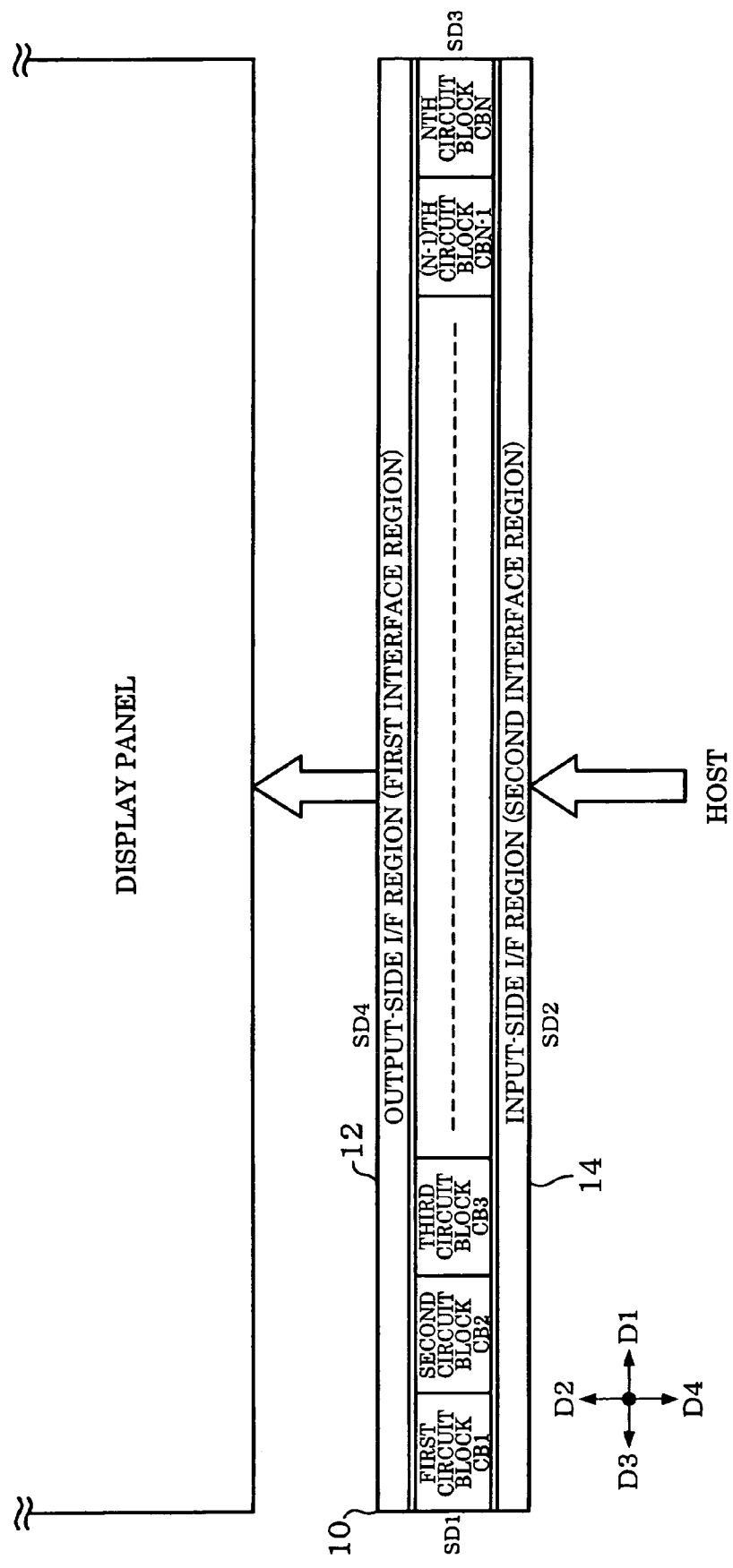
FIG. 12 shows an arrangement example of an integrated circuit device.

FIG. 12 shows an arrangement example of the integrated circuit device 10. The integrated circuit device 10 includes first to Nth circuit blocks CB1 to CBN (N is an integer of two or more) disposed along a direction D1. The integrated circuit device 10 also includes an output-side I/F region 12 (first interface region in a broad sense) provided along a side SD4 on the direction D2 side of the first to Nth circuit blocks CB1 to CBN. The integrated circuit device 10 also includes an input-side I/F region 14 (second interface region in a broad sense) provided along a side SD2 on the direction D4 side of the first to Nth circuit blocks CB1 to CBN. In more detail, the output-side I/F region 12 (first I/O region) is disposed on the direction D2 side of the circuit blocks CB1 to CBN without other circuit blocks or the like interposed therebetween, for example. The input-side I/F region 14 (second I/O region) is disposed on the direction D2 side of the circuit blocks CB1 to CBN without other circuit blocks or the like interposed therebetween, for example. Specifically, only one circuit block (data driver block) exists in the direction D2 in the area in which at least the data driver block exists. When the integrated circuit device 10 is used as an intellectual property (IP) core and incorporated in another integrated circuit device, at least one of the I/F regions 12 and 14 may be omitted from the integrated circuit device 10.

The output-side (display panel side) I/F region 12 is a region which serves as an interface between the integrated circuit device 10 and the display panel, and includes pads and various elements connected with the pads, such as output transistors and protective elements. In more detail, the output-side I/F region 12 includes output transistors for outputting the data signal to the data line and outputting the scan signal to the scan line, for example. When the display panel is a touch panel or the like, the output-side I/F region 12 may include input transistors.

The input-side I/F (host side) region 14 is a region which serves as an interface between the integrated circuit device 10 and a host (MPU, image processing controller, or baseband engine), and may include pads and various elements connected with the pads, such as input (input/output) transistors, output transistors, and protective elements. In more detail, the input-side I/F region 14 includes input transistors for inputting a signal (digital signal) from the host, output transistors for outputting a signal to the host, and the like.

An output-side or input-side I/F region may be provided along the short side SD1 or SD3. Bumps which serve as external connection terminals or the like may be provided in the I/F (interface) regions 12 and 14, or may be provided in the region (first to Nth circuit blocks CB1 to CBN) other than the I/F regions 12 and 14. When providing the bumps in the region other than the I/F regions 12 and 14, the bumps are formed using a small bump technology (e.g. bump technology using a resin core) other than a gold bump technology.

The first to Nth circuit blocks CB1 to CBN may include at least two (or three) different circuit blocks (circuit blocks having different functions). For example, when the integrated circuit device 10 is a display driver, the circuit blocks CB1 to CBN may include at least two of a data driver block, memory block, scan driver block, logic circuit block, grayscale voltage generation circuit block, and power supply circuit block. In more detail, the circuit blocks CB1 to CBN may include at least a data driver block and a logic circuit block, and may further include a grayscale voltage generation circuit block.

When the integrated circuit device 10 includes a built-in memory, the circuit blocks CB1 to CBN may further include a memory block.

Figure 13:
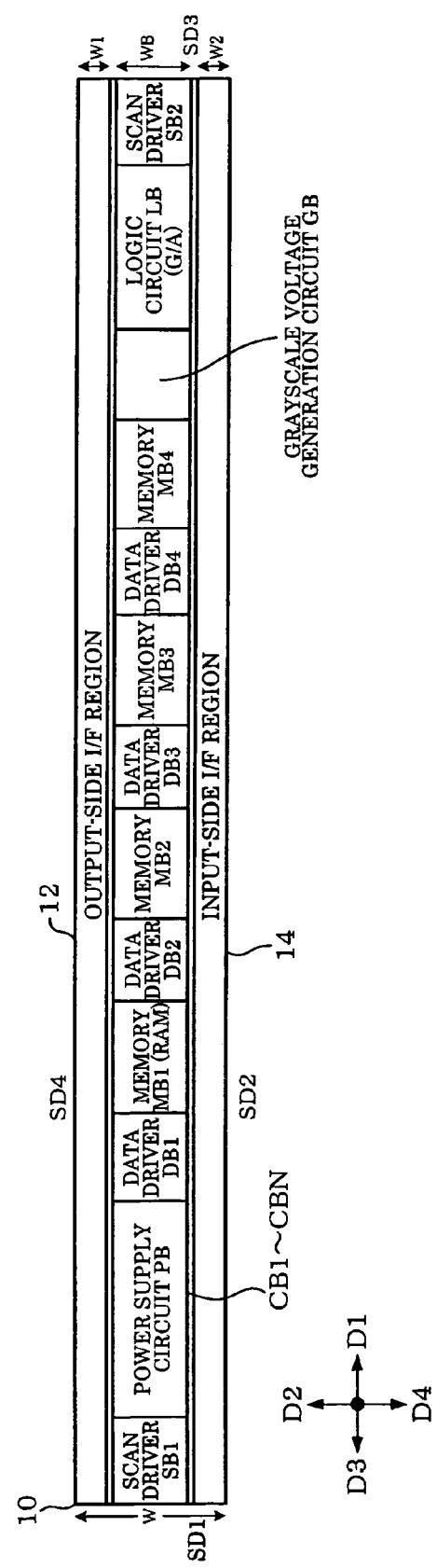
FIG. 13 shows a detailed arrangement example of an integrated circuit device.

FIG. 13 shows a detailed example of the planar layout of the integrated circuit device 10. In FIG. 13, the first to Nth circuit blocks CB1 to CBN include first to fourth memory blocks MB1 to MB4 (first to Ith memory blocks in a broad sense; I is an integer of two or more). The first to Nth circuit blocks CB1 to CBN also include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are adjacently disposed along the direction D1, and the memory block MB2 and the data driver block DB2 are adjacently disposed along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

The layout arrangement of the integrated circuit device 10 according to this embodiment is not limited to that shown in FIG. 13. For example, the number of memory blocks or data driver blocks may be two, three, or five or more, or the memory block and the data driver block may not be divided into blocks. A modification is also possible in which the memory block is not adjacent to the data driver block. A configuration may also be employed in which the memory block, the scan driver block, the power supply circuit block, or the grayscale voltage generation circuit block is not provided. A circuit block with a significantly small width in the direction D2 (narrow circuit block with a width equal to or less than the width WB) may be provided between the circuit blocks CB1 to CBN and the output-side I/F region 12 or the input-side I/F region 14. The circuit blocks CB1 to CBN may include a circuit block in which different circuit blocks are arranged in stages along the direction D2. For example, the scan driver circuit and the power supply circuit may be integrated into one circuit block.

Figure 14A:
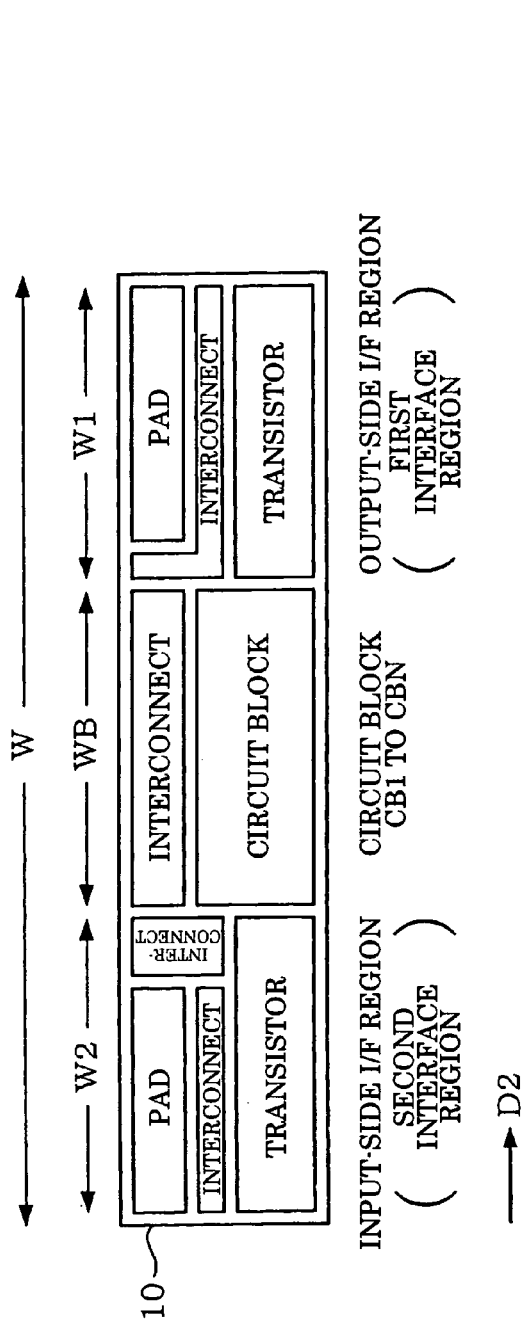
FIGS. 14A and 14B show examples of a cross-sectional view of an integrated circuit device.

FIG. 14A shows an example of a cross-sectional view of the integrated circuit device 10 along the direction D2. W1, WB, and W2 respectively indicate the widths of the output-side I/F region 12, the circuit blocks CB1 to CBN, and the input-side I/F region 14 in the direction D2. The widths W1, WB, and W2 indicate the widths (maximum widths) of transistor formation regions (bulk regions or active regions) of the output-side I/F region 12, the circuit blocks CB1 to CBN, and the input-side I/F region 14, respectively, and exclude bump formation regions. W indicates the width of the integrated circuit device 10 in the direction D2.

In this embodiment, as shown in FIG. 14A, a configuration can be achieved in which another circuit block is not provided between the circuit blocks CB1 to CBN and the output-side and input-side I/F regions 12 and 14 in the direction D2. Therefore, the width W may be set at $W1+WB+W2 \leq W \leq W1+2\times WB+W2$. Or, since $W1+W2<WB$ is satisfied, the width W may be set at $W<2\times WB$.

Figure 14B:
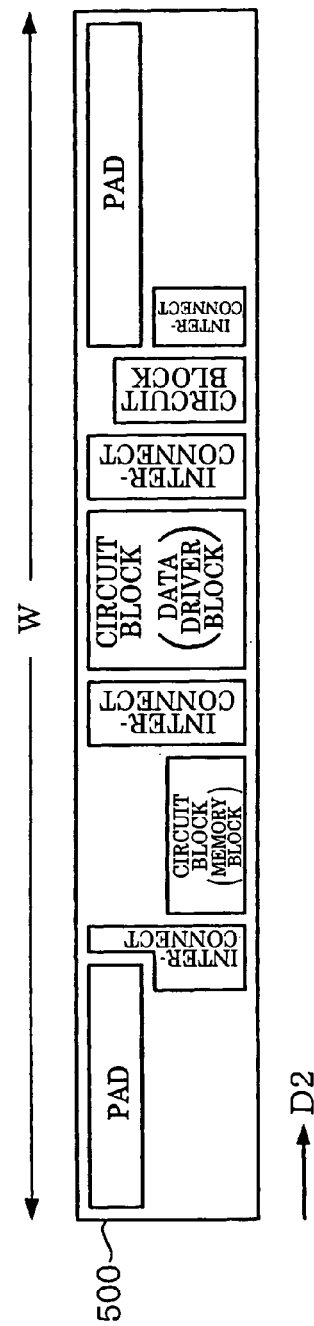

In the arrangement method shown in FIG. 14B, two or more circuit blocks are disposed along the direction D2. In more detail, the data driver block and the memory block are disposed along the direction D2.

In FIG. 14B, image data from the host is written into the memory block, for example. The data driver block converts the digital image data written into the memory block into an analog data voltage, and drives the data lines of the display panel. Therefore, the image data signal flows along the direction D2. In FIG. 14B, the memory block and the data driver block are disposed along the direction D2 corresponding to the signal flow.

On the other hand, the arrangement method shown in FIG. 14B has the following problems.

First, a reduction in chip size is required for an integrated circuit device such as a display driver in order to reduce cost. However, when the chip size is reduced by merely shrinking the integrated circuit device using a microfabrication technology, the size of the integrated circuit device is reduced not only in the short side direction but also in the long side direction. This makes it difficult to mount the integrated circuit device due to the narrow pitch.

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. According to the arrangement method shown in FIG. 14B, even if the pad pitch, the cell pitch of the memory, and the cell pitch of the data driver coincide in a certain product, the pitches do not coincide when the configurations of the memory and the data driver are changed. If the pitches do not coincide, an unnecessary wiring region must be formed between the circuit blocks in order to absorb the difference in pitch. As a result, the width of the integrated circuit device in the direction D2 is increased, whereby cost is increased due to an increase in the chip area. If the layout of the memory and the data driver is changed so that the pad pitch coincides with the cell pitch in order to avoid such a situation, the development period is increased, whereby cost is increased.

In the arrangement methods shown in FIGS. 12 and 13, the circuit blocks CB1 to CBN are disposed along the direction D1. In FIG. 14A, the transistor (circuit element) can be disposed under the pad (bump) (active surface bump). Moreover, a signal line between the circuit blocks or between the circuit block and the I/F region can be formed using a global line formed in the upper layer (lower layer of the pad) of local lines which are lines in the circuit blocks. Therefore, the width W in the direction D2 can be reduced while maintaining the length of the integrated circuit device 10 in the direction D1, whereby a narrow chip can be realized.

In the arrangement methods shown in FIGS. 12 and 13, since the circuit blocks CB1 to CBN are disposed along the direction D1, it is possible to easily deal with a change in the product specification or the like. Specifically, since products of various specifications can be designed using a common platform, the design efficiency can be improved. In FIG. 13, when the number of pixels or the number of grayscales of the display panel is increased or decreased, it is possible to deal with such a situation by merely increasing or decreasing the number of memory blocks or data driver blocks, the number of readings of image data in one horizontal scan period, or the like. FIG. 13 illustrates an example of an amorphous TFT panel display driver including a memory. When developing a low-temperature polysilicon TFT panel display driver including a memory, it suffices to remove the scan driver block from the circuit blocks CB1 to CBN. When developing a product which does not include a memory, it suffices to remove the memory block. Since the effects of removal of the circuit block corresponding to the specification on other circuit blocks are minimized, the design efficiency can be improved.

In the arrangement methods shown in FIGS. 12 and 13, the widths (heights) of the circuit blocks CB1 to CBN in the direction D2 can be adjusted to the width (height) of the data driver block or the memory block, for example. When the number of transistors of each circuit block is increased or decreased, since it is possible to deal with such a situation by increasing or decreasing the length of each circuit block in the direction D1, the design efficiency can be further improved. For example, when the number of transistors of each circuit block is increased or decreased in FIG. 13 due to a change in the configuration of the grayscale voltage generation circuit block or the power supply circuit block, it is possible to deal with such a situation by increasing or decreasing the length of the grayscale voltage generation circuit block or the power supply circuit block in the direction D1.

8. Arrangement of Logic Circuit Block and Power Supply Circuit Block

Figure 15:
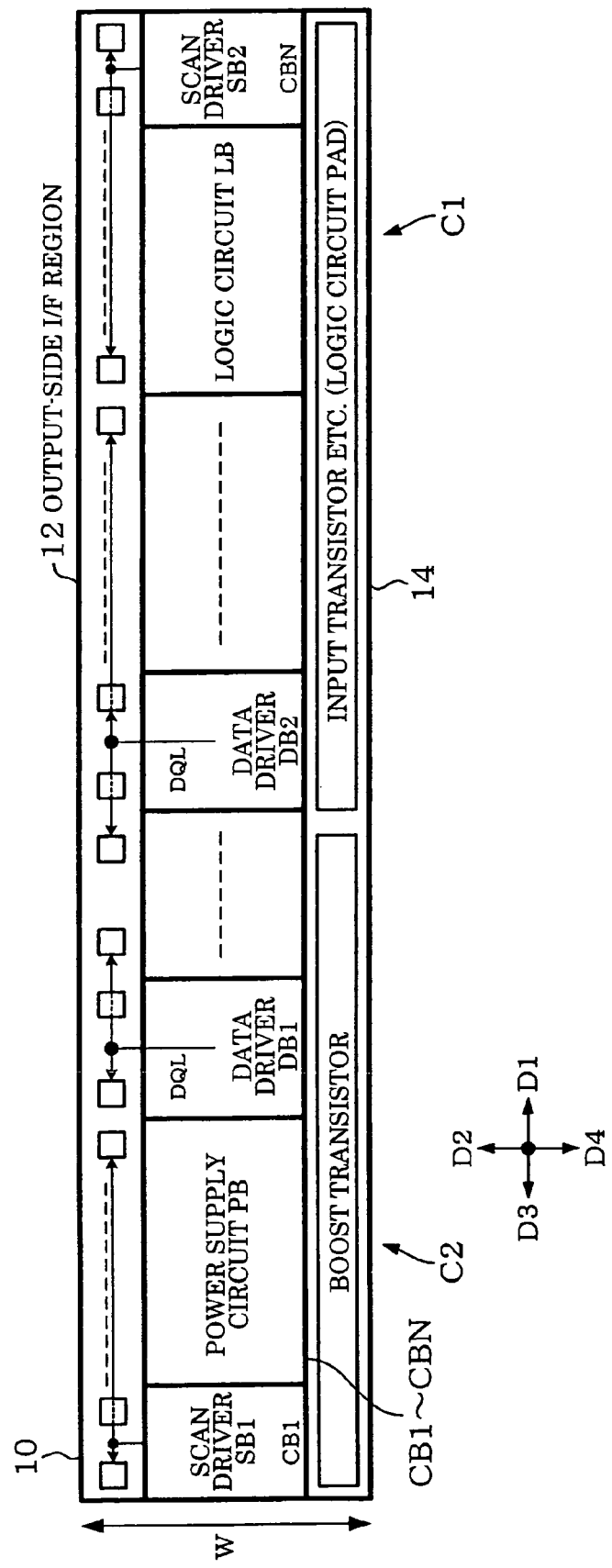
FIG. 15 is a view illustrative of an arrangement method for a logic circuit block and a power supply circuit block.

In this embodiment, as shown in FIG. 15, the circuit blocks CB1 to CBN include a logic circuit block LB (Kth circuit block in a broad sense) which sets adjustment data for the power supply voltage, and a power supply circuit block PB (Lth circuit block in a broad sense; 1≦K≦L≦N) which generates the power supply voltage based on the set adjustment data. The circuit blocks CB1 to CBN also include the data driver blocks DB1 to DB4 (at least one data driver block in a broad sense) for driving the data lines. In FIG. 15, other circuit blocks are disposed between the logic circuit block LB and the power supply circuit block PB. In more detail, the data driver blocks DB1 to DB4 as other circuit blocks are disposed between the logic circuit block LB and the power supply circuit block PB.

According to the arrangement shown in FIG. 15, the logic circuit block LB and the power supply circuit block PB having a relatively large circuit area are disposed on either side of the data driver blocks DB1 to DB4. Therefore, logic circuit pads and input transistors formed under the pads can be disposed by utilizing the free space (space indicated by C1) on the direction D4 side of the logic circuit block LB. Moreover, the boost transistors of the power supply circuit having a large size and the like can be disposed by utilizing the free space (space indicated by C2) on the direction D4 side of the power supply circuit block PB.

According to the arrangement shown in FIG. 15, since the data driver blocks DB1 to DB4 can be disposed near the center of the integrated circuit device, the data signal output lines from the data driver blocks DB1 to DB4 can be efficiently and simply provided in the output-side I/F region 12. Therefore, the wiring efficiency and the arrangement efficiency in the output-side I/F region 12 and the input-side I/F region 14 can be increased so that the width W of the integrated circuit device in the direction D2 can be reduced, whereby a narrow integrated circuit device can be realized.

When the logic circuit block LB and the power supply circuit block PB are disposed as shown in FIG. 15, the distance between the logic circuit block LB and the power supply circuit block PB is increased. In particular, the length LD of the integrated circuit device in the long side direction (direction D1) is set at 15 mm<LD<27 mm by employing the arrangement methods shown in FIGS. 12 and 13, whereby a very narrow chip is formed. Therefore, the distance between the logic circuit block LB and the power supply circuit block PB is increased to a large extent.

When the distance between the logic circuit block LB and the power supply circuit block PB is increased, the length of the signal line for the power supply voltage adjustment data which connects these blocks is also increased. Therefore, erroneous adjustment data is likely written into the register of the power supply circuit block PB due to noise caused by ESD or the like.

In this embodiment, as shown in FIG. 8A, the malfunction prevention circuit 70 is provided between the logic circuit block LB (circuit block 60) and the power supply circuit block PB (circuit block 90). Therefore, even if the logic circuit block LB and the power supply circuit block PB are disposed at a large distance, as shown in FIG. 15, a situation can be prevented in which the adjustment data is erroneously written due to noise caused by ESD or the like. The wiring efficiency and the arrangement efficiency in the output-side I/F region 12 and the input-side I/F region 14 can be improved by disposing the logic circuit block LB and the power supply circuit block PB at a large distance, as shown in FIG. 15, whereby the width W of the integrated circuit device in the direction D2 can be reduced. Therefore, a narrow integrated circuit device can be realized while improving the ESD immunity.

9. Electronic Instrument

Figure 16A:
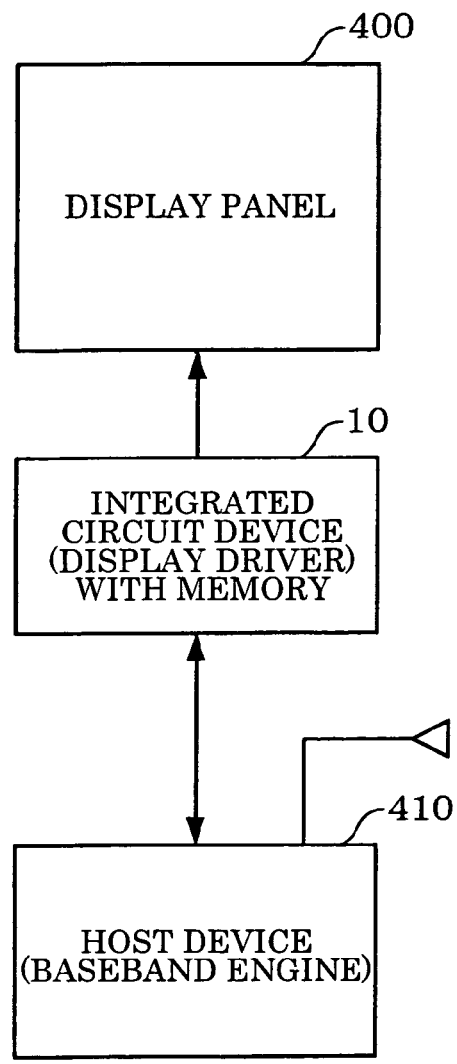
FIGS. 16A and 16B show configuration examples of an electronic instrument.
Figure 16B:
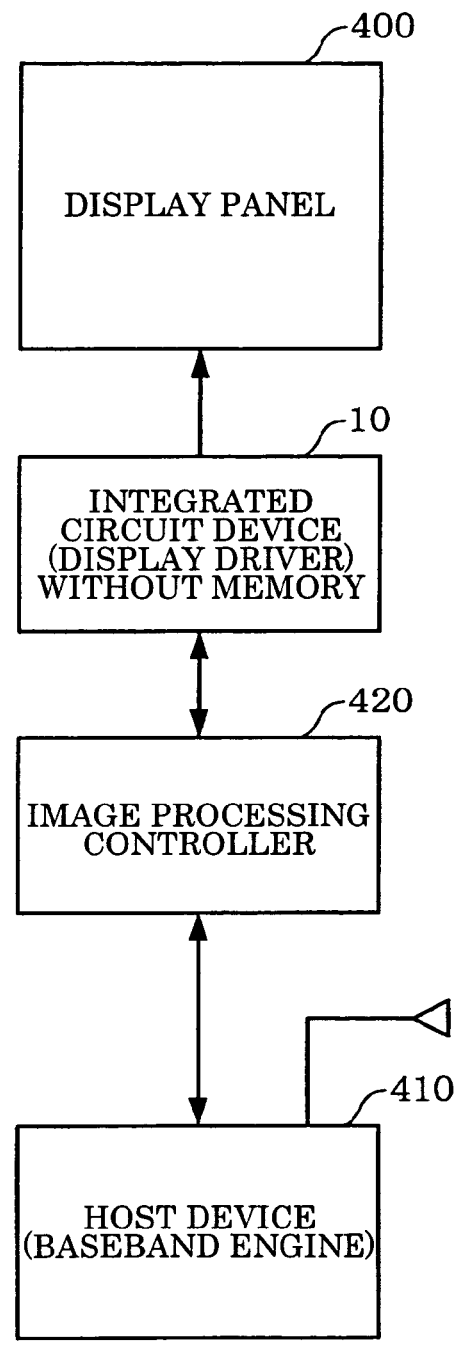

FIGS. 16A and 16B show examples of an electronic instrument (electro-optical device) including the integrated circuit device 10 according to the above embodiment. The electronic instrument may include elements (e.g. camera, operation section, or power supply) other than the elements shown in FIGS. 16A and 16B. The electronic instrument according to this embodiment is not limited to a portable telephone, but may be a digital camera, PDA, electronic notebook, electronic dictionary, projector, rear-projection television, portable information terminal, or the like.

In FIGS. 16A and 16B, a host device 410 is an MPU, a baseband engine, or the like. The host device 410 controls the integrated circuit device 10 which is a display driver. The host device 410 may also perform processing of an application engine or a baseband engine, or processing of a graphic engine such as compression, decompression, and sizing. An image processing controller 420 shown in FIG. 16B performs processing of a graphic engine such as compression, decompression, or sizing instead of the host device 410.

In FIG. 16A, an integrated circuit device including a memory may be used as the integrated circuit device 10. In this case, the integrated circuit device 10 writes image data from the host device 410 into the built-in memory, and reads the written image data from the built-in memory to drive the display panel. In FIG. 16B, an integrated circuit device which does not include a memory may be used as the integrated circuit device 10. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. data signal, L level, or H level) cited with a different term (e.g. input signal, first voltage level, or second voltage level) having a broader meaning or the same meaning at least once in the specification and the drawings can be replaced by the different term in any place in the specification and the drawings. The configuration, arrangement, and operation of the integrated circuit device and the electronic instrument are not limited to those described in the above embodiments. Various modifications and variations may be made.

What is claimed is:

1. An integrated circuit device comprising:
an I/O circuit which buffers and outputs an input signal from a pad when an enable signal is set at a second voltage level;
a malfunction prevention circuit; and a circuit block to which an output signal from the I/O circuit is input through the malfunction prevention circuit, the malfunction prevention circuit outputting to the circuit block an output signal of which a voltage level is set by a first power supply in a first period in which the enable signal is set at a first voltage level and in a second period including a period in which the enable signal changes from the first voltage level to the second voltage level, and outputting to the circuit block the output signal corresponding to the output signal from the I/O circuit in a third period subsequent to the second period in which the enable signal is set at the second voltage level.

2. The integrated circuit device as defined in claim 1, wherein the malfunction prevention circuit includes:

a signal processing circuit which receives the enable signal and outputs a signal obtained by subjecting the enable signal to at least one of signal delay processing and filter processing as a second enable signal; and a selector to which a voltage level of the first power supply is input at a first input and the output signal from the I/O circuit is input at a second input and which selects one of the first and second inputs based on the second enable signal and outputs an output signal.

3. The integrated circuit device as defined in claim 1, wherein the first power supply is a power supply differing from a power supply supplied to the I/O circuit.

4. The integrated circuit device as defined in claim 1, comprising:

first to Jth I/O circuits which buffer and output first to Jth input signals from first to Jth pads when the enable signal is set at the second voltage level; and first to Jth malfunction prevention circuits which output to the circuit block first to Jth output signals of which voltage levels are set by the first power supply in the first and second periods, and output to the circuit block the first to Jth output signals corresponding to the output signals from the first to Jth I/O circuits in the third period.

5. The integrated circuit device as defined in claim 4, wherein, when respective commands for the integrated circuit device are assigned to respective combinations of signal levels of the first to Jth input signals from the first to Jth pads, the first to Jth malfunction prevention circuits output to the circuit block the first to Jth output signals of which the combination of the signal levels is not assigned to the command in the first and second periods.

6. An integrated circuit device comprising:

a Kth circuit block which outputs an output signal when an enable signal is set at a second voltage level;

an Lth circuit block to which the output signal from the Kth circuit block is input; and a malfunction prevention circuit which outputs to the Lth circuit block an output signal of which a voltage level is set by a first power supply in a first period in which the enable signal is set at a first voltage level and a second period including a period in which the enable signal changes from the first voltage level to the second voltage level, and outputs to the Lth circuit block an output signal corresponding to the output signal from the Kth circuit block in a third period subsequent to the second period in which the enable signal is set at the second voltage level.

7. The integrated circuit device as defined in claim 6, wherein the Kth circuit block is a logic circuit block; and wherein the Lth circuit block is a power supply circuit block which is controlled by the logic circuit block and generates a power supply voltage.

8. The integrated circuit device as defined in claim 6, wherein the Kth circuit block is a logic circuit block; and wherein the Lth circuit block is a grayscale voltage generation circuit block which is controlled by the logic circuit block and generates grayscale voltages.

9. The integrated circuit device as defined in claim 6, wherein the malfunction prevention circuit includes:

a signal processing circuit which receives the enable signal and outputs a signal obtained by subjecting the enable signal to at least one of signal delay processing and filter processing as a second enable signal; and a selector to which a voltage level of the first power supply is input at a first input and the output signal from the Kth circuit block is input at a second input and which selects one of the first and second inputs based on the second enable signal and outputs an output signal.

10. The integrated circuit device as defined in claim 6, wherein the Kth circuit block outputs an address signal, a data signal, and the enable signal to the Lth circuit block; and wherein the malfunction prevention circuit outputs to the Lth circuit block an address signal of which a voltage level is set by the first power supply in the first and second periods, and outputs to the Lth circuit block an address signal corresponding to the address signal from the Kth circuit block in the third period.

11. The integrated circuit device as defined in claim 10, wherein the malfunction prevention circuit outputs to the Lth circuit block an address signal which is not assigned in a normal operation mode in the first and second periods as the address signal of which the voltage level is set by the first power supply.

12. The integrated circuit device as defined in claim 6, wherein the Kth circuit block outputs an address signal, a data signal, and the enable signal to the Lth circuit block; and wherein the malfunction prevention circuit outputs to the Lth circuit block a data signal of which a voltage level is set by the first power supply in the first and second periods, and outputs to the Lth circuit block a data signal corresponding to the data signal from the Kth circuit block in the third period.

13. The integrated circuit device as defined in claim 6, comprising:

first to Nth circuit blocks disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

wherein the first to Nth circuit blocks include the Kth circuit block and the Lth circuit block ($1 \leq K \leq L \leq N$); and wherein another circuit block is disposed between the Kth circuit block and the Lth circuit block.

14. The integrated circuit device as defined in claim 7, comprising:

first to Nth circuit blocks disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

wherein the first to Nth circuit blocks include the Kth circuit block and the Lth circuit block ($1 \leq K \leq L \leq N$); and wherein another circuit block is disposed between the Kth circuit block and the Lth circuit block.

15. The integrated circuit device as defined in claim 8, comprising:

first to Nth circuit blocks disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

wherein the first to Nth circuit blocks include the Kth circuit block and the Lth circuit block ($1 \leq K \leq L \leq N$); and wherein another circuit block is disposed between the Kth circuit block and the Lth circuit block.

16. An electronic instrument comprising:
the integrated circuit device as defined in claim 1; and
a display panel driven by the integrated circuit device.

17. An electronic instrument comprising:
the integrated circuit device as defined in claim 6; and
a display panel driven by the integrated circuit device.

\* \* \* \* \*